(12) United States Patent
Tanaka et al.

(10) Patent No.: US 6,861,185 B2
(45) Date of Patent: Mar. 1, 2005

(54) METHOD OF MANUFACTURING COLOR FILTER, COLOR FILTER, AND DISPLAY

(75) Inventors: Keiichi Tanaka, Tenri (JP); Satoru Kishimoto, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/751,643

(22) Filed: Jan. 6, 2004

(65) Prior Publication Data

US 2004/0142254 A1 Jul. 22, 2004

(30) Foreign Application Priority Data

Jan. 7, 2003 (JP) ........................................ 2003-001530

(51) Int. Cl.$^7$ .......................... G02B 5/20; G02F 1/1335
(52) U.S. Cl. ............................ 430/7; 349/106; 347/106
(58) Field of Search ............................ 430/7; 349/106, 349/114; 347/106

(56) References Cited

U.S. PATENT DOCUMENTS 5,391,442 A * 2/1995 Tsushima et al. .............. 430/7
5,681,675 A * 10/1997 Kurauchi et al. ............. 430/20
5,716,740 A * 2/1998 Shiba et al. .................... 430/7

FOREIGN PATENT DOCUMENTS

| JP | 05-273410 A | 10/1993 |
| JP | 11-305248 A | 11/1999 |

* cited by examiner

Primary Examiner—John A. McPherson
(74) Attorney, Agent, or Firm—Birch, Stewart, Kolasch & Birch, LLP.

(57) ABSTRACT

A method of manufacturing a color filter in accordance with the present invention includes: (i) a latent image forming step in which, with respect to a polysilane film, first and second exposure processes having different exposure patterns and different ultraviolet light exposure amounts are carried out, and colorants are applied to the polysilane film on which first and second latent images are formed; and a coloration step in which the first and second latent images are colored by applying colorants thereto. With this, it is possible to form a first density area corresponding to transmissive image reproduction and a second density area corresponding to a second density area. Accordingly a high-quality color filter for multi-scene displays can be manufactured with fewer manufacturing steps.

27 Claims, 15 Drawing Sheets

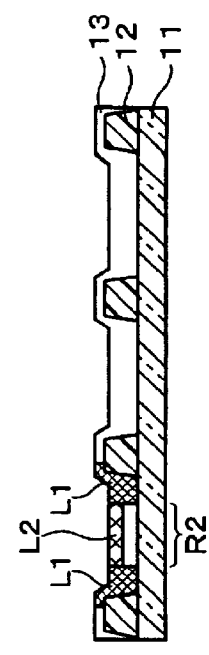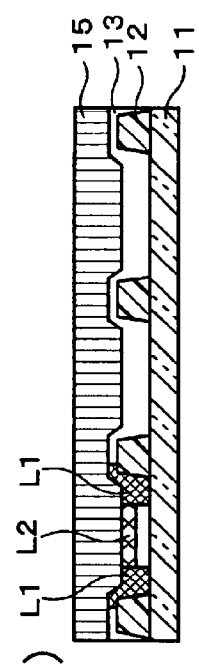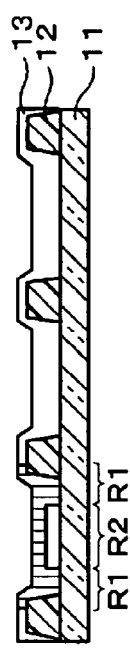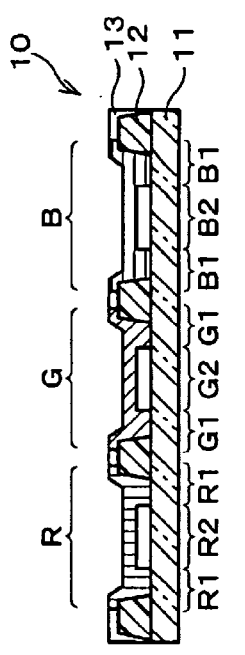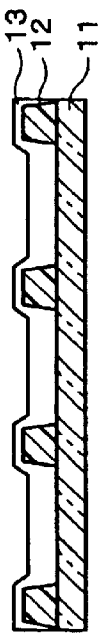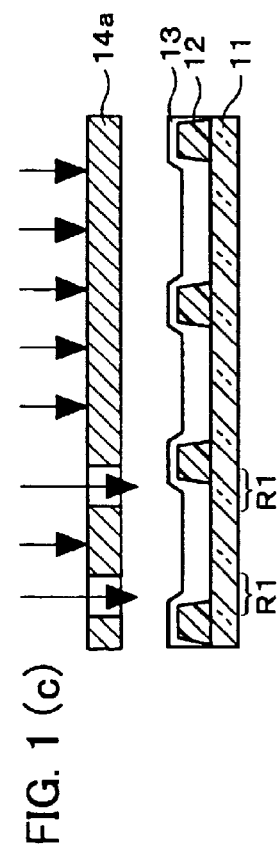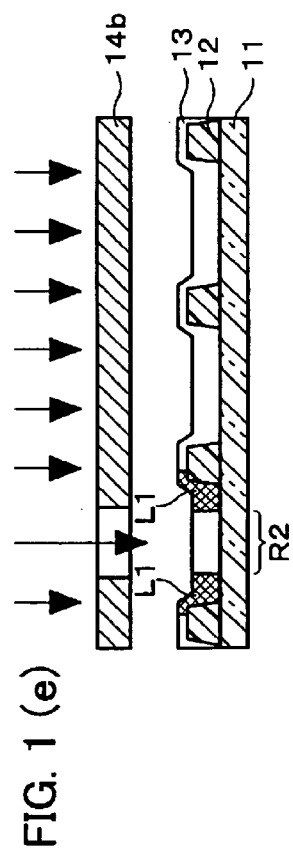
FIG. 1 (a)   FIG. 1 (f)
FIG. 1 (b)   FIG. 1 (g)
FIG. 1 (c)   FIG. 1 (h)
FIG. 1 (d)   FIG. 1 (i)
FIG. 1 (e)

METHOD OF MANUFACTURING COLOR FILTER, COLOR FILTER, AND DISPLAY

This Nonprovisional application claims priority under 35 U.S.C. § 119(a) on Patent Application No. 2003/1530 filed in Japan on Jan. 7, 2003, the entire contents of which are hereby incorporated by reference.

FIELD OF THE INVENTION

The present invention relates to a color filter for a display, a method of manufacturing the color filter, and a display including the color filter, and the present invention particularly relates to a color filter suitable for a display capable of carrying out both reflective image reproduction and non-reflective image reproduction, a method of manufacturing the color filter, and a display including the color filter.

BACKGROUND OF THE INVENTION

Thanks to their advantages in thickness, weight, power consumption and the like, liquid crystal displays have widely been diffused as displays for word processors, computers, navigation systems and so on. Concurrently with this, liquid crystal displays have become able to reproduce high-quality and colored images.

Among others, one type of those liquid crystal displays has been particularly popular, that is, active matrix liquid crystal displays, in which pixels are disposed in a matrix manner, and as a switching element, an active element such as a thin film transistor is provided in each pixel, have become mainstream.

A typical active matrix liquid crystal display includes a first glass substrate provided with scanning lines, gradation signal lines, switching elements, and pixel electrodes, and a second glass substrate provided with a black matrix, color filter, and common electrode. These first and second glass substrates face each other with a certain space in between, and this space is filled with a liquid crystal material and the periphery of the space is sealed using a thermosetting or photo-setting sealing material. In each pixel, gradation image reproduction is realized by controlling a voltage between a pixel electrode and common electrode.

As multi-scene displays, mobile liquid crystal displays typified by mobile phones and PDAs (Personal Digital Assistants) are supposed to be used in various circumstances both in indoors and outdoors. For such a multi-scene display, a display panel which can carry out both reflective image reproduction and transmissive image reproduction has been proposed.

When such a display panel carries out reflective image reproduction with a color filter optimized for transmissive image reproduction, outside light passes through the color filter twice, namely on the occasion of entry and on the occasion of exit, so that the quantity of light as a result of reflection is extremely low. On the other hand, when transmissive image reproduction is carried out with a color filter optimized for reflective image reproduction, the range of color reproduction is extremely narrow. In both cases, the quality of images reproduced by the display deteriorates.

To solve this problem, for instance, Japanese Laid-Open Patent Application No. 11-305248/1999 (Tokukaihei 11-305248; published on Nov. 5, 1999) teaches, as shown in FIG. 14, the use of a color filter 100 including first color filters 101 and second color filters 102, each pair of the filters being of different chromaticity. In the color filter 100, respective pairs of the first color filters 101 and second color filters 102 are provided for colors of R (red), G (green), and B (blue). The chromaticity of the first color filters 101 is set so as to be identical with the chromaticity indicated by a chain line a in the chromaticity diagram in FIG. 15, and the chromaticity of the second color filters 102 is set so as to be identical with the chromaticity indicated by a dashed line b in the chromaticity diagram in FIG. 15.

In a liquid crystal display adopting the color filter 100, the first color filters 101 are associated with transmissive image reproduction, and the second color filters 102 are associated with reflective image reproduction. This realizes that a color of the light for transmissive image reproduction, which passes through the first color filters 101 once, is substantially identical with a color of the light for reflective image reproduction, which passes through the second color filters 102 twice.

The color filter 100 described above is conventionally formed by a pigment-dispersed photoresist method. The steps of manufacturing the color filter 100 by the pigment-dispersed photoresist method are as follows: A photoresist (color resist) in which a pigment is dispersed is applied to a substrate, and the applied color resist is exposed to light with a predetermined exposure pattern and developed, so that the color resist is removed except those parts to be the first color filter 101. As a result, the first color filter 101 is formed. The second color filter 102 is also formed in a similar manner. In this way, respective pairs of the first and second color filters 101 and 102 are formed for the colors of R, G, and B.

Meanwhile, being different from the pigment-dispersed photoresist method, for instance, Japanese Laid-Open Patent Application No. 5-273410/1993 (Tokukaihei 5-273410; published on Oct. 22, 1993) proposes a method of forming a color filter by a coloration using polysilane. According to this method, a polysilane layer is selectively exposed to ultraviolet light so that a latent image of a coloration pattern is formed on the polysilane layer, and this polysilane layer with the latent image of the coloration is soaked in a coloring colloidal solution made of metal alkoxide and including a pigment, and then dried. As a result, that part of the polysilane layer where the latent image is formed is colored so that this colored part can be utilized as a color filter.

However, when the color filter 100 which is shown in FIG. 14 and includes the pairs of the first and second color filters 101 and 102 of different chromaticity, the pairs corresponding to the respective colors of R, G, and B, is formed using a conventional pigment-dispersed photoresist method, both the step of forming the first color filter 101 and the step of forming the second color filter 102 have to be repeated twice in order to form one pair of the first and second color filters 101 and 102, and these steps further have to be repeated in order to form the pairs corresponding to the respective colors of R, G, and B. Thus, it is necessary to carry out the forming steps for 2×3=6 times. As a result, the number of the steps increases.

In each of the foregoing forming steps, furthermore, the color resist is applied, patterned and then removed except necessary parts. On this account, since the number of times the forming steps are carried out is large, an amount of the color resist removed as unnecessary parts is also large. As a result, a large amount of resist material is required for forming the color filter, so that the materials cost increases.

Moreover, when the pigment-dispersed photoresist method is used, it is difficult to manufacture the color filter 100 having the shape shown in FIG. 14, so that the color filter 100 would actually be shaped as in FIGS. 16(a)–16(c). Note that, the arrangement of the first and second color filters 101 and 102 in FIGS. 16(*a*)–16(*c*) is different from that of FIG. 14, for the sake of convenience.

As in FIG. 16(*a*), the first and second color filters 101 and 102 formed by the pigment-dispersed photoresist method are longitudinally tapered. For this reason, a gap g is formed between the neighboring first and second color filters 101 and 102.

Further, as illustrated in FIG. 16(*b*), a level difference d may be formed between the first and second color filters 101 and 102, due to the difference in thickness when these filters are formed.

As FIG. 16(*c*) shows, when the first and second color filters 101 and 102 are misaligned on the occasion of the patterning, for instance, a non-film portion v and a multiple-film portion w may be formed in the second color filter 102. Generally, the formation of these portions is caused by the misalignment of 3–5 μm.

As described above, these gap g, level difference d, non-film portion v, and multiple-film portion w cause the leakage of light and a domain is produced, and thus causing the quality of reproduced images to deteriorate.

SUMMARY OF THE INVENTION

One feature of the present invention is to provide, for instance, a method of manufacturing a high-quality color filter with fewer manufacturing steps.

In accordance with this feature, the method of manufacturing a color filter in accordance with the present invention is characterized by comprising the steps of: (i) forming latent images, in which a photosensitive film is subjected to, with a predetermined exposure pattern, an exposure process using a predetermined type of light, the photosensitive e film being altered to be colorable by a colorants when expressed to the predetermined type of light and a degree of colorability of the photosensitive film varying in accordance with an ex sure amount of the predetermined type of light, so that the latent images in accordance with the predetermined exposure pattern are formed on the photosensitive film; and (ii) coloring the latent images by applying the colorants to the photosensitive film on which the latent images have been formed, with different exposure patterns and different exposure light amounts, the exposure process in the step (i) being repeated more than once.

According to the method above, in the step (i), the photosensitive film is exposed to the predetermined type of light so that those parts of the photosensitive film which correspond to the exposure pattern are altered so as to be colorable by the colorants, and consequently the latent images are formed. Then in the step (ii), the colorants is applied to the photosensitive film so that the latent images are colored. In this manner, it is possible to form a color mask, in which parts corresponding to the exposure pattern are colored.

The photosensitive film is arranged so that the degree of colorability thereof varies in accordance with an amount of exposure of the particular type of light. In the method above, the exposure process in the step (i) is repeated for more than once, with different exposure patterns and different exposure light amounts. Thus, in the step (i), a plurality of latent images having different degrees of colorability are formed. On this account, these latent images are colored in the step (ii) so that a plurality of density areas having different color densities are formed.

With this, the method above makes it possible to manufacture a color filter for multi-scene displays, which can carry out both reflective image reproduction and transmissive image reproduction.

To form a plurality of density areas by a conventional pigment-dispersed photoresist method, it is necessary to form films corresponding to the respective density areas. Thus, a gap and level difference are formed between the films being separately formed, and moreover, a non-film portion and multiple-film portion formed due to an alignment error on the occasion of forming the films. Because of them, the quality of the color filter is deteriorated. On the other hand, according to the above-described method, a plurality of density areas can be formed on a common photosensitive film, so that the formation of the gap, level difference, non-film portion, and multiple-film portion is restrained. For this reason, the above-described method makes it possible to manufacture a high-quality color filter.

To form a plurality of density areas by a conventional pigment-dispersed photoresist method, furthermore, it is necessary to repeat the steps of applying a color resist, carrying out patterning by exposing light, and removing an unnecessary part, for the respective density areas. On the other hand, according to the above-described method, a plurality of color densities are set in the step (i) so that the step (ii) for applying the colorants can be commonly carried out for all of the density areas.

As a result, the plurality of density areas can be formed with a fewer number of coloration steps, so that the total number of manufacturing steps can be reduced. Further, total amounts of the required colorants can be reduced and the materials cost can also be reduced.

In this manner, the method of manufacturing the color filter of the present invention is preferably arranged such that the latent images formed by the respective exposure processes are simultaneously colored by carrying out the step (ii) after the exposure processes.

Note that, although the method above is suitable for manufacturing a color filter for multi-scene displays, it can also be applied for manufacturing other types of color filters requiring more than one density areas.

The above-mentioned method is preferably arranged in such a manner that a first exposure light amount in a first exposure process which is one occasion of the exposure process being repeated is set to be not less than a saturated exposure light amount at which color density when coloring the photosensitive film in the step (ii) carried out later is saturated, and a second exposure light amount in a second exposure process which is another occasion of the exposure process being repeated is set to be less than the saturated exposure light amount.

According to this method, it is possible to form density areas corresponding to the first exposure light amount and the second exposure light amount, respectively. In the first exposure process, the exposure is carried out with the first exposure light amount which is not less than the saturated exposure light amount. For this reason, even if a portion having been subjected to the exposure in the first exposure process is further subjected to the exposure, virtually the color density of the portion does not vary. Thus, the method above makes it possible to prevent the occurrence of irregularity of color density in the density area corresponding to the first exposure light amount.

The above-mentioned method is preferably arranged in such a manner that the exposure patterns corresponding to the first and second exposure processes, respectively, have respective overlapped parts where the exposure patterns overlap each other.

According to this method, the overlapped parts are used as a margin of alignment error, so that the formation of a non-exposed area is prevented even if the alignment error between the exposure patterns occurs. The non-exposed area is not colored in the subsequent step (ii). Thus, the above-mentioned method prevents the formation of the uncolored part, thereby making it possible to manufacture a high-quality color filter.

It is preferable that the above-mentioned method further comprises, in order to form more than one hue areas having different hues, the steps (i) and (ii) for respective hue areas.

According to this method, in order to form more than one hue areas, the steps (i) and (ii) are repeated in accordance with the number of the hue areas to be formed. With this, it is possible in the step (ii) to apply each of the colorants to all hue areas on the photosensitive film without providing partitions therein, and hence the step (ii) can be simplified.

The above-mentioned method is preferably arranged in such a manner that, to form more than one hue areas having different hues, the step (i) is commonly carried out for all of said more than one hue areas, and in the step (ii), colorants corresponding to the respective hues are applied to said more than one hue areas.

According to this method, it is unnecessary to repeat the steps (i) and (ii) for the respective hue areas so that the number of the steps can be reduced. Furthermore, since the colorants are applied to the respective hue areas in the step (ii), amounts of the required colorants can be substantially minimized, and hence the materials cost can be effectively reduced.

It is noted that the photosensitive film is preferably a polysilane film and the predetermined type of light is preferably ultraviolet light.

A color filter of an embodiment of the present invention, including sets of a plurality of density areas having different color densities, the sets corresponding to respective colors, is characterized by comprising a photosensitive film which alters to be colorable by a colorants when exposed to a predetermined type of light and whose degree of colorability varies in accordance with an amount of the predetermined type of light for exposure, wherein, said plurality of density areas are formed in such a manner that, the photosensitive film is subjected to exposure to different rays of light, with different exposure patterns and different exposure light amounts, so that latent images corresponding to the respective exposure patterns are formed, and then these latent images are colored by applying the colorants to the respective latent images.

Alternatively, the color filter of an embodiment of the present invention, including sets of a plurality of density areas having different color densities, the sets corresponding to respective colors, is characterized by comprising a photosensitive film which alters to be colorable by a colorants when exposed to a predetermined type of light and whose degree of colorability varies in accordance with an amount of the predetermined type of light used for exposure, wherein, said plurality of density areas have different coloration depths in a direction perpendicular to the photosensitive film.

The above-mentioned color filter can be manufactured by the foregoing manufacturing method. Thus, the color filter has high quality and can be manufactured with fewer manufacturing steps and lower materials cost.

A display of an embodiment of the present invention is characterized by comprising the above-mentioned color filter. Since the above-mentioned high-quality color filter is incorporated therein, the display can reproduce high-quality images. Further, as described above, since the color filter can be manufactured with fewer manufacturing steps and lower materials cost, it is possible to realize a low-priced display.

A display of an embodiment of the present invention, which can carry out both reflective image reproduction and non-reflective image reproduction, is characterized by comprising: the above-mentioned color filter; a reflector for the reflector for the reflective image reproduction; and a substrate with the reflector, the substrate facing the color filter, wherein, said plurality of density areas are two density areas of different types, and the reflector is provided so as to correspond to one density area of said two density areas, in said one density area, an exposure light amount of said predetermined type of light when forming the latent images being fewer than an exposure light amount in the other one of said two density areas.

A display of an embodiment of the present invention, which can carry out both reflective image reproduction and non-reflective image reproduction, is characterized by comprising: the above-mentioned color filter; a reflector for the reflective image reproduction; and a substrate with the reflector, the substrate facing the color filter, wherein, said plurality of density areas are two density areas of different types, and the reflector is provided so as to correspond to one density area of said two density areas, in said one density area, a coloration depth in a direction perpendicular to the photosensitive film being shallower than a coloration depth in the other one density area of said two density areas.

With the foregoing arrangements, it is possible to realize a multi-scene display which is low-priced but can reproduce high-quality images.

For a fuller understanding of the nature and advantages of the invention, reference should be made to the ensuing detailed description taken in conjunction with the accompanying drawings.

BRIEF DESCRIPTION OF THE DRAWINGS

FIGS. 1(a)–1(i) are cross sections, showing the steps of manufacturing a color filter of Embodiment 1 of the present invention.

DESCRIPTION OF THE EMBODIMENTS

Embodiment 1

The following will describe an embodiment of the present invention with reference to FIGS. 1(a)–1(i) through 9. A color filter in the present embodiment is supposed to be suitably incorporated into a display panel of a multi-scene display which can carry out both reflective image reproduction and non-reflective image reproduction such as transmissive image reproduction and self-luminous image reproduction.

Figure 2:
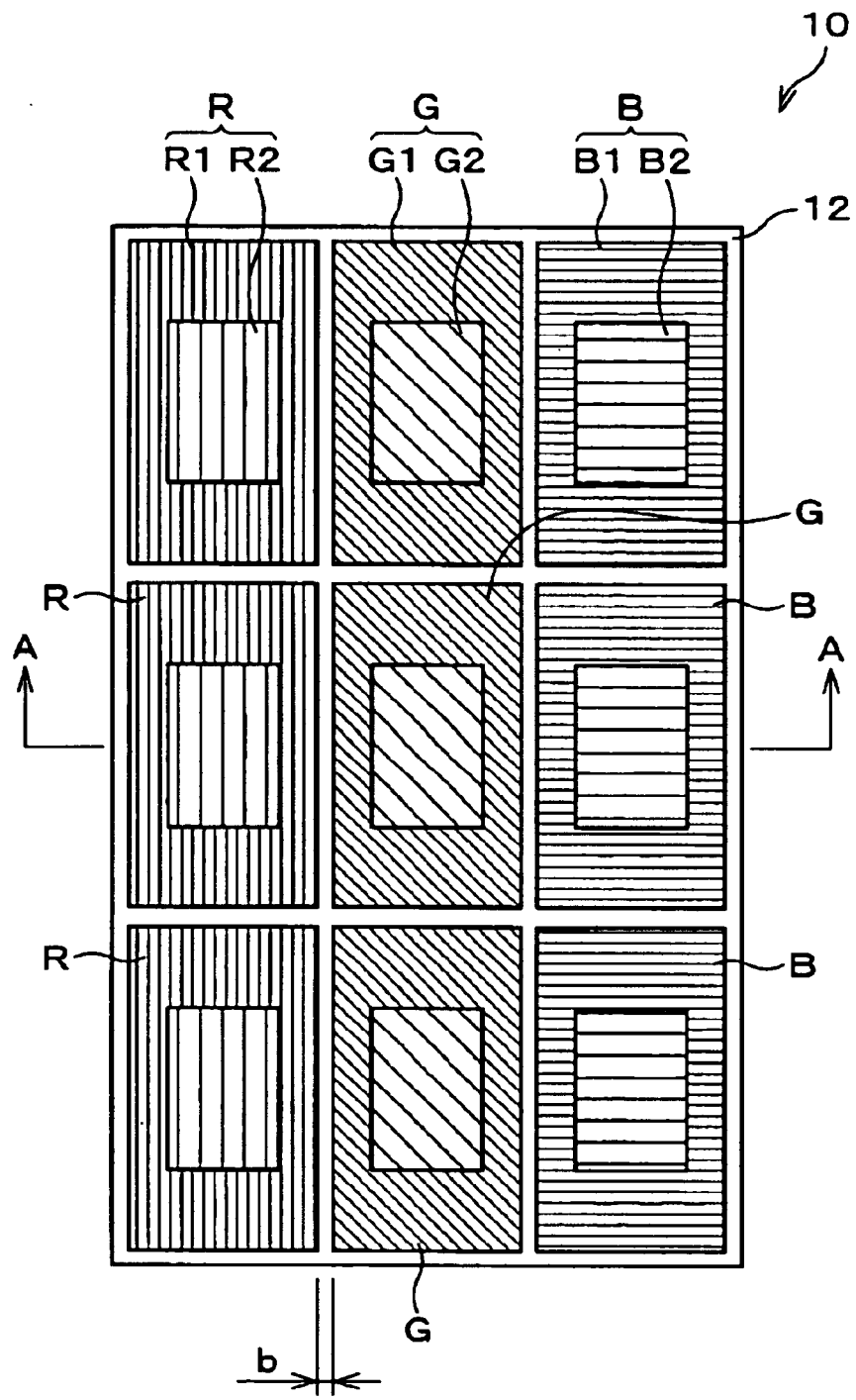
FIG. 2 is a plan view of the color filter of Embodiment 1 of the present invention.

This color filter includes cells disposed in a matrix manner, and these cells correspond to respective pixels of the display. FIG. 2 shows the disposition of these cells, and in this case, 3 by 3 matrix of cells partitioned with a black matrix 12. Each of these cells is any one of a cell R which is a part of a red filter, a cell G which is a part of a green filter, and a cell B which is a part of a blue filter. A group of the cells R, a group of the cells G, and a group of the cells B are hue areas of different hues, and these groups are termed an R filter, G filter, and B filter, respectively.

In each of the cells R, G, and B, a first density area R1, G1, or B1 having a higher color density and a second density area R2, G2, or B2 having a lower color density are formed. The first density areas R1, G1, and B1 correspond to the non-reflective image reproduction, whereas the second density areas R2, G2, and B2 correspond to the reflective image reproduction.

Note that, although the cells in FIG. 2 are stripe-aligned, the cells may be delta-aligned or mosaic-aligned.

A method of manufacturing a color filter 10 of the present embodiment will be described with reference to FIGS. 1(a)–1(i). Note that, FIGS. 1(a)–1(i) are cross sections taken along the line A—A in FIG. 2.

First, as shown in FIG. 1(a), the black matrix (BM) 12 is formed on a substrate 11 by a black matrix forming step. In this black matrix forming step, a photosensitive resin material in which carbon is dispersed is applied to the entirety of the substrate 11 which is, for instance, 1.5 $\mu$m thick and made of materials such as glass, by a spin coat method. Then the photosensitive resin material is baked and dried in an oven for, for instance, 120 seconds at 110° C. After being baked and dried, the photosensitive resin material is exposed to ultraviolet light with a predetermined exposure pattern. This exposure is proximity exposure carried out on the top surface of the photosensitive resin material, with, for instance, an exposure gap (proximity gap) of 50 $\mu$m. Then development is carried out by removing a non-exposed area (that is, an area not being exposed to light) of the photosensitive resin material using an alkali developing agent after the exposure. After the development, drying is carried out for, for instance, 90 minutes at 250° C., so that the black matrix 12 having a predetermined pattern as in FIG. 2 is formed. The line width b between neighboring hue areas in the black matrix 12 is, for instance, about 8 $\mu$m.

Although the present embodiment assumes that the photosensitive resin material is a negative material, a positive material may be used. Any materials may be used as the photosensitive resin material on condition that the characteristics required for the black matrix 12, such as resolution, light shielding property, and adhesiveness, are satisfied.

Next, as shown in FIG. 1(b), a polysilane film 13 is formed, as the above-mentioned photosensitive film, on the substrate 11 and black matrix 12 by a polysilane film forming step. In this polysilane film forming step, polysilane is applied to the entirety of the substrate 11 for, for instance, 1.5 $\mu$m thick, by a spin coat method. Then the applied polysilane is dried in an oven for, for instance, 120 seconds at 110° C., so that the polysilane film 13 is formed.

Then a latent image forming step shown in FIGS. 1(c)–1(f) is carried out. This latent image forming step includes a first exposure process shown in FIGS. 1(c) and 1(d) and a second exposure process shown in FIGS. 1(e) and 1(f). Note that, the processes shown in FIGS. 1(c)–1(f) are sub-steps of the latent image forming step, for forming the cells R. Although not shown, the latent image forming step is repeated for the respective hue areas, i.e. for the R filter, G filter, and B filter, respectively. The latent image forming step for forming the cells G is carried out after a below-mentioned coloration step of the cells R, and the latent image forming step for forming the cells B is carried out after a coloration step of the cells G.

In the first exposure process, ultraviolet light is applied to a portion corresponding to the first density area R1 of the cell R, with the first exposure mask 14a. A first exposure light amount. M which is an amount of light for this exposure is, for instance, around 3.6 J/cm$^2$ according to a measurement of the total amount of exposed light with respect to the i-line.

Figure 3:
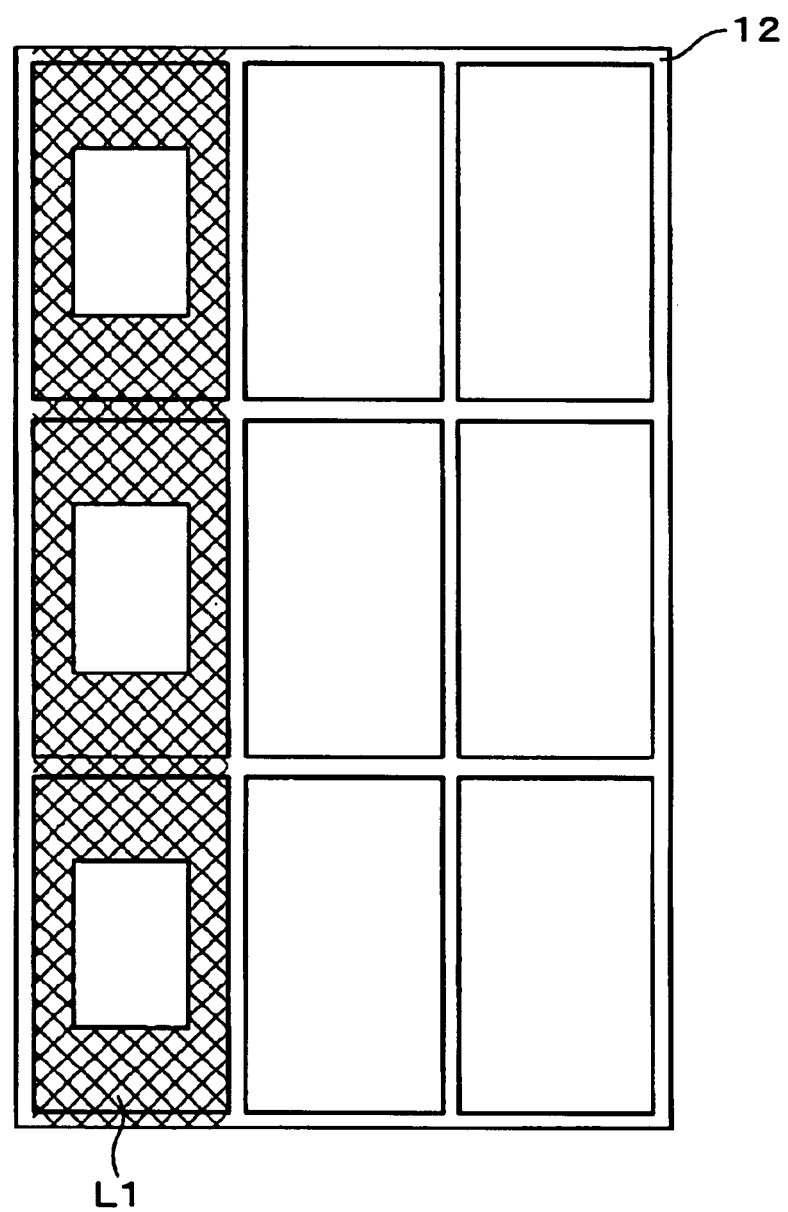
FIG. 3 is a plan view, showing first latent images formed by a first exposure process shown in FIG. 1(c).

With the above, Si—Si bond in the polysilane film 13 is cut off by the application of ultraviolet light, so that SiOH (silanol group) is generated and the polysilane film 13 is altered. Thus, as FIG. 1(d) illustrates, a first latent image L1 including the silanol group is formed in the portion corresponding to the first density area R1 in accordance with the pattern of ultraviolet light exposure. Since the first latent image L1 in this state cannot be visually checked, FIG. 3 schematically shows a plan view of the portion where the first latent image L1 is formed.

In the second exposure process, ultraviolet light is applied to a portion corresponding to the second density area R2 of the cell R, using a second exposure mask 14b whose exposure pattern is different from that of the first exposure mask 14a. A second exposure light amount N which is an amount of light for this exposure is less than the first exposure light amount M, so as to be, for instance, about 1.8 J/cm$^2$.

Also in this case, silanol group is generated in the polysilane film 13 so that the polysilane film 13 is altered. Then in the polysilane film 13, a second latent image L2 including the silanol group is formed, as shown in FIG. 1(f), in a portion corresponding to the second density area R2 in accordance with the pattern of ultraviolet light exposure.

However, since the exposure light amount in the second exposure process is smaller than that of the first exposure process, the degree of the generation of the silanol group due to the alteration of the polysilane is small, so that the silanol group is generated in the polysilane film 13 at a shallow depth, i.e. in the vicinity of the surface of the polysilane film 13. On this account, in the polysilane film 13, the second latent image L2 including the silanol group which is lower in density than the silanol group in the first latent image L1 is formed, as shown in FIG. 1(*f*), in the portion corresponding to the second density area R2 in accordance with the pattern of ultraviolet light exposure.

Figure 4:
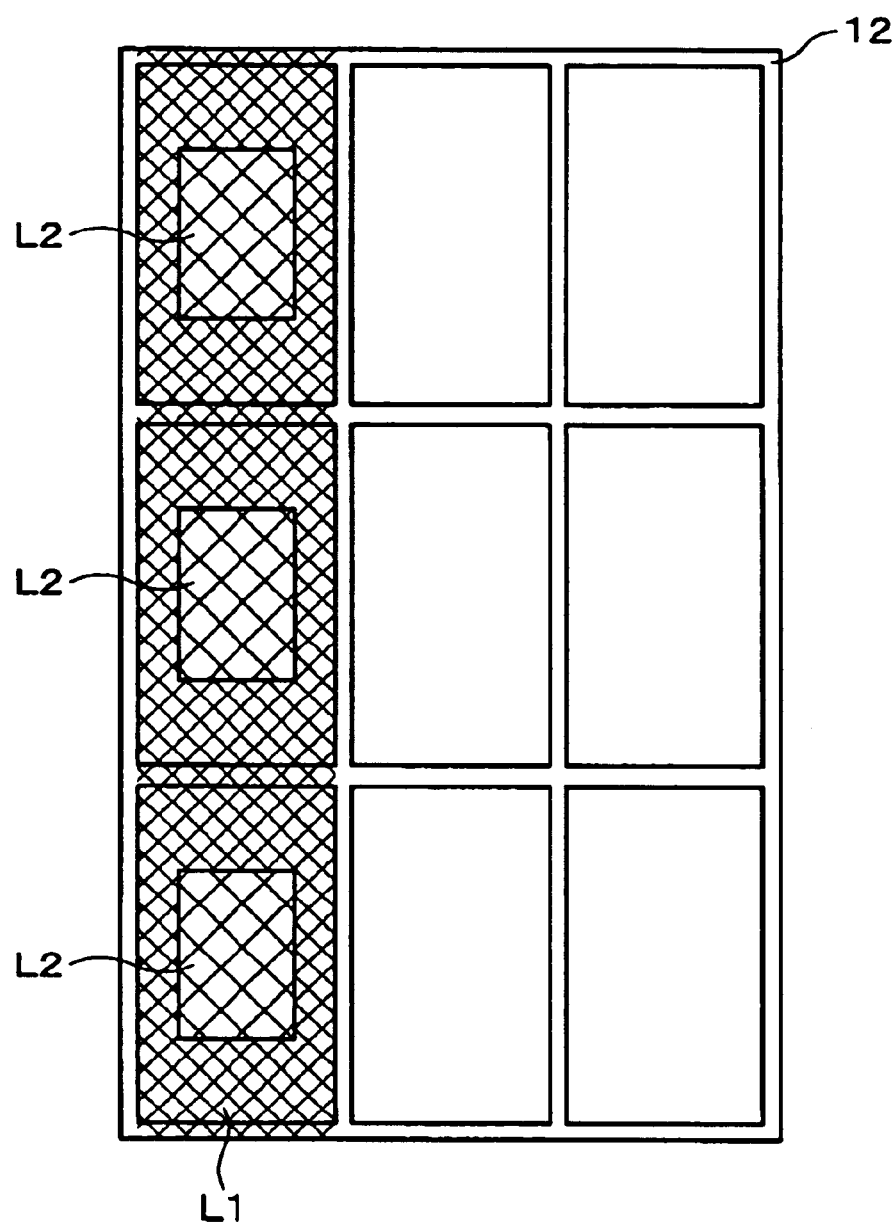
FIG. 4 is a plan view, showing the first latent images formed by the first exposure process shown in FIG. 1(c) and second latent images formed by a second exposure process shown in FIG. 1(e).

Also in this case, since the first and second latent images L1 and L2 cannot be visually checked, FIG. 4 schematically shows a plan view of the portions where the first and second latent images L1 and L2 are formed.

In the present case, it is preferable that the first exposure light amount M is not less than a saturated exposure light amount S whereas the second exposure light amount N is not more than the saturated exposure light amount S. This saturated exposure light amount S is an amount of light for the exposure, when the color density on the occasion of coloring the polysilane film 13 in the below-mentioned coloration step is saturated. That is to say, when the polysilane film 13 is exposed to light and colored, virtually the color density after the coloration does not vary irrespective of the exposure light amount, if the exposure light amount on the occasion of the exposure is not less than a predetermined value. The predetermined value in this case is the saturated exposure light amount S. Note that, the color density does not virtually vary, because, when the color filter 10 is adopted, the variation of the color density is so small that human eyes cannot perceive.

As described above, the first exposure light amount M is set to be 3.6 J/cm$^2$ and the second exposure light amount N is set to be 1.8 J/cm$^2$, so that the first exposure light amount M is not less than the saturated exposure light amount S, while the second exposure light amount N is less than the saturated exposure light amount S.

Thus, even if the portion corresponding to the first density area R1 is also exposed to the light on the occasion of carrying out the second exposure process, it is possible to virtually prevent the color density of the first density area R1 from being varied. On this account, it is possible to prevent the occurrence of irregularity of color density.

Figure 5:
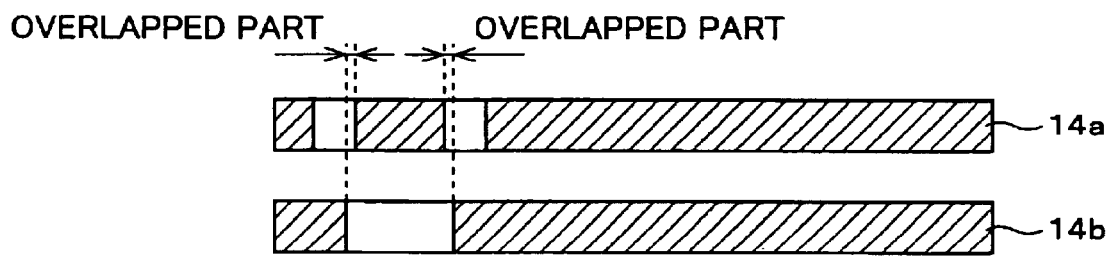
FIG. 5 is a cross section, illustrating the relationship between a first exposure mask for the first exposure process shown in FIG. 1(c) and a second exposure mask for the second exposure process shown in FIG. 1(e).

It is preferable that a part of the exposure pattern of the second exposure mask 14*b* is overlapped with the exposure pattern of the first exposure mask 14*a*. The cross section of the first and second exposure masks 14*a* and 14*b* in this arrangement is shown in FIG. 5.

With this, it is possible to relax the precision of alignment between the first exposure mask 14*a* and the second exposure mask 14*b*. This is because the overlapped part is used as a margin of alignment error so that the formation of a non-exposed area is prevented both in the first exposure process and second exposure process, even if the alignment error between the first and second exposure masks 14*a* and 14*b* occurs. The non-exposed area is not colored in the subsequent coloration step, thereby causing the leakage of light when the color filter 10 is incorporated into a display panel.

Note that, the periphery of the first density area R1, which is the overlapped part, is subjected to both the first exposure process and the second exposure process so as to be exposed to the light more than once. However, the amount of the light for the first exposure process is equal to the first exposure light amount not less than the saturated exposure light amount S. Thus, in the first density area R1, the color density is virtually identical in the part subjected to the exposure more than once and in the remaining part. For this reason, it is possible to prevent the occurrence of the irregularity in color density, when the color filter 10 is incorporated into a display panel.

Next, the coloration step shown in FIGS. 1(*g*) and 1(*h*) is carried out. Note that, the step shown in FIGS. 1(*g*) and 1(*h*) is a coloration step for forming the cell R. Although not being illustrated, the coloration step is repeated for the respective hue areas, i.e. for the R filter, G filter, and B filter, respectively. It is further noted that the coloration step for forming the cell G is carried out after the latent image forming step for forming the cell G, and the coloration step for forming the cell B is carried out after the latent image formation step for forming the cell B.

In the coloration step, a colorants corresponding to the color of the cell to be formed is applied to the surface of the polysilane film 13 on which the latent image has been formed in the latent image forming step, so that the latent image is colored. The colorants in this case is a colloidal solution including a pigment having a color corresponding to the color of the cell. The colorants is applied to the surface of the polysilane film 13, for instance, in the following manners.

According to a first method, the substrate 11 in which the polysilane film 13 is provided is soaked in the colorants, and then shaken for about 300 seconds in the colorants. This method is easily carried out.

According to a second method, a film 15 of the colorants, is formed for about 2 $\mu$m thick by a spin coat method as shown in FIG. 1(*g*), and then left for 300 seconds. Then the colorants remaining on the surface is removed using an air knife. This method can be carried out relatively easily.

According to a third method, a film 15 of the colorants, which is about 2 $\mu$m thick, is formed using a slit, instead of the spin coat method in the second method. That is, the colorants is supplied to the surface of the polysilane film 13 via the slit which scans the surface. According to this method, the colorants does not adhere to those portions of the polysilane film 13 which are other than the surface, as in the case of the first method, and the colorants does not scatter when applying the same, as in the case of the second method. For these reasons, an amount of the colorants used in the third method is smaller than amounts of the colorants used in the first and second methods.

Note that, these first to third methods are mere examples so that any methods may be used as long as the colorants permeates from the surface of the polysilane film 13 into the inside thereof.

The colorants permeates through the polysilane film 13 in the manner as above, so that the color pigment in the colorants interacts with the silanol group in the polysilane film 13 and hence the color pigment is fixed in the polysilane film 13.

Subsequently, the polysilane film 13 and the substrate 11 are washed using pure water, and then heated and dried for, for instance, 20 minutes at 150° C. As a result, the colloidal solution as the colorants is crosslinked and gelled, so as to be firmly fixed in the polysilane film 13. With this, it is possible to form the colored cell R on which a colored latent image is formed, as shown in FIG. 1(*h*).

The coloration step described above is carried out after the first and second exposure processes. Thus, the first and second latent images L1 and L2, which have been formed by the respective first and second exposure processes, are simultaneously colored. Furthermore, the first and second density area R1 and R2 have predetermined coloration depths in accordance with the first and second latent images L1 and L2, respectively, so that predetermined types of color density are arranged so as to be suitable for the respective rays of light passing through the color filter 10. With this, it is possible to form the R filter in which one cell R has two types of color density. Note that, "color density" in this specification indicates a spectral transmittance of light passing through the color filter 10.

In this manner, after carrying out the latent image forming step and the coloration step for forming the cell R, the latent image forming step and the coloration step for forming the cell G and the latent image forming step and the coloration step for forming the cell B are successively carried out, and consequently the color filter 10 shown in FIGS. 1(i) and 2 is formed.

The color filter 10 formed as above has the first and second density areas having different coloration depths with respect to the perpendicular direction of the polysilane film 13.

Next, a material suitably used for manufacturing the color filter 10 will be described. Polysilane for forming the polysilane film 13 is preferably arranged as in the following chemical formula.

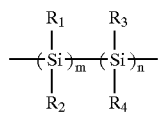

In this formula, $R_1$, $R_2$, $R_3$, and $R_4$ are independently selected from the group consisting of substituted or non-substituted aliphatic hydrocarbon residue, alicyclic hydrocarbon residue, and aromatic hydrocarbon residue, and m and n are integers.

Examples of the most preferable polysilane are such as phenylmethylpolysilane in which $R_1$ is methyl group and $R_2$ is phenyl group, and phenylmethyl/methyltrifluoropropylcopolysilane in which $R_1$ is methyl group, $R_2$ is phenyl group, $R_3$ is methyl group, and $R_4$ is trifluoropropyl group.

As the colorants, in the meantime, a colored colloidal solution which includes at least one type of dye or pigment and is made of metal alkoxide is preferably used. In consideration of light resistance and heat resistance, pigment is more preferable than dye.

The C.I. numbers of preferable pigments are such as pigment red 220, pigment red 221, pigment red 53:1, pigment blue 15:3, pigment blue 60, pigment green 7, and pigment violet 37.

The preferable materials of the colored sol is, for instance, metal (e.g. silicon, aluminum, zirconium, and titan) alkoxide, which is typically used for a sol-gel process. A particularly preferable material is silicon alkoxide which is easy to handle with. For instance, tetraethoxysilane is dissolved in a mixed solvent of alcohol and water, and then a pigment is dispersed in the solution which has been produced as a result of the dissolving. Subsequently, acid is added to the solution and the solution is stirred for 2 hours, so that the tetraethoxysilane is hydrolyzed and dehydrocondensed, and consequently colored sol having uniform silica is obtained.

The composition of the colored sol is preferably as follows: 50–200 parts by weight of ethanol, 50–200 parts by weight of water, 0.1–3 parts by weight of hydrochloric acid, and 0.5–25 parts by weight of pigment with respect to 100 parts by weight of ethyl silicate. In some cases, water-soluble organic solvent such as acetonitrile, dioxane, and tetrahydrofuran may be further added.

Note that, the above-mentioned materials are mere examples and hence the present invention is not limited to these materials. In other words, instead of the polysilane film 13, it is possible to adopt any kinds of photosensitive films (i) which alter to be colorable by a colorants when exposed to a predetermined type of light and (ii) whose degree of the coloration varies in accordance with an amount of the predetermined type of light for the exposure. The predetermined type of light is light having an wavelength within a predetermined wavelength range, and in the present case, the predetermined type of light for the polysilane film 13 is ultraviolet light. Thus, the colorants used in the present case has to be able to color the above-described photosensitive films.

As described above, the method of manufacturing the color filter in accordance with the present invention includes: the latent image forming step in which a photosensitive film, which alters to be colorable by a colorants when exposed to a predetermined type of light and whose degree of the coloration varies in accordance with an amount of the predetermined type of light for the exposure, is exposed to the predetermined type of light with a predetermined exposure pattern, so that a latent image corresponding to the exposure pattern is formed on the photosensitive film; and the coloration step in which the colorants is applied to the photosensitive film on which the latent image is formed so that the latent image is colored. The latent image forming step further includes a plurality of exposure processes which use different exposure patterns and different amounts of light.

Figure 16:
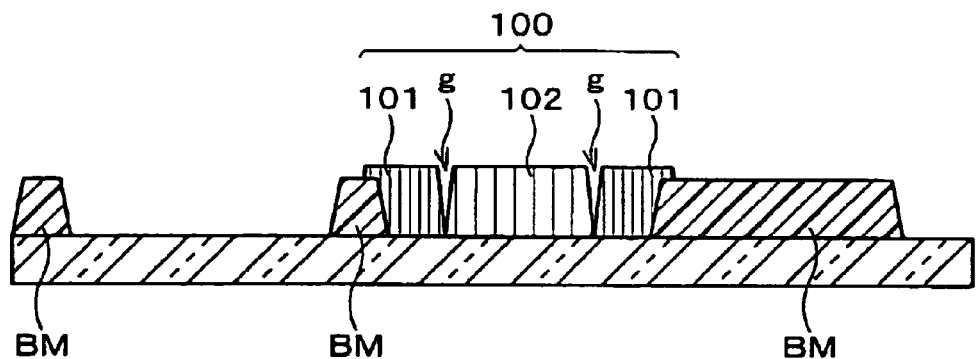
FIGS. 16(a), 16(b), and 16(c) are cross sections, illustrating problems involved in the formation of a color filter by a conventional pigment-dispersed photoresist method.
Figure 16:
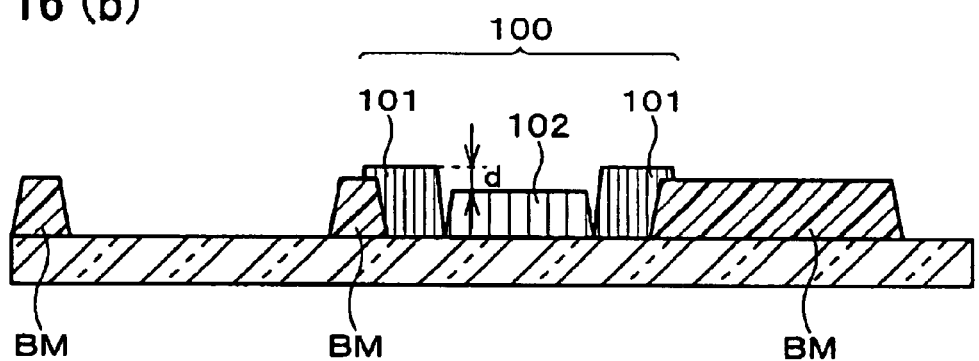
Figure 16:
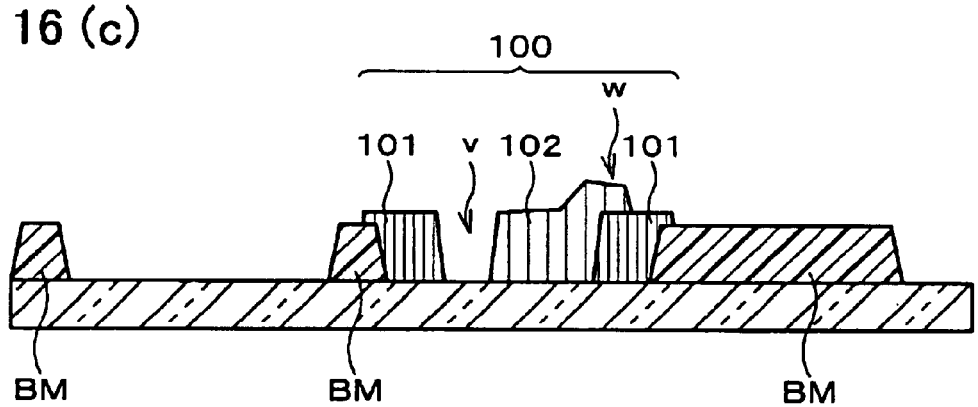

To form a plurality of density areas by a conventional pigment-dispersed photoresist method, it is necessary to form films for the respective density areas. Thus, as shown in FIGS. 16(a) and 16(b), a gap g and level difference d may be formed between the films which are separately formed. Furthermore, as shown in FIG. 16(c), the alignment error on the occasion of the formation of the films may result in the formation of a non-film portion v and a multiple-film portion w. This causes the degradation of the quality of the color filter.

To solve this problem, the manufacturing method of the present invention is arranged so that a plurality of density areas can be formed in a common photosensitive film, thereby hardly resulting in the gap g, level difference d, non-film portion v, and multiple-film portion w. For this reason, the manufacturing method of the present makes it possible to manufacture a high-quality color filter.

To form a plurality of density areas by a conventional pigment-dispersed photoresist method, it is necessary to repeat the steps of applying color resist, patterning by exposure to light, and removing unnecessary portions, for the respective density areas. On the contrary, according to the method of the present invention, it is possible to set more than one color densities in the latent image forming step, so that the coloration step for applying the colorants can be commonly carried out for all of the density areas of the same color.

As a result, since the number of carrying out the coloration step for forming more than one density areas can be reduced, the number of the total steps and an amount of the colorants can be reduced, so that the materials cost can be reduced.

Note that, although the present embodiment describes the method of manufacturing the color filter 10 for the multi-scene display, the manufacturing method of the present invention can be applied for manufacturing other types of color filters requiring a plurality of density areas.

The present embodiment describes that, in the method of manufacturing the color filter 10 having two types of density areas for one hue, two types of exposure processes are carried out for one hue. However, in accordance with the use of the color filter, not less than 3 density areas may be provided and thus not less than 3 types of exposure processes may be carried out.

Figure 6:
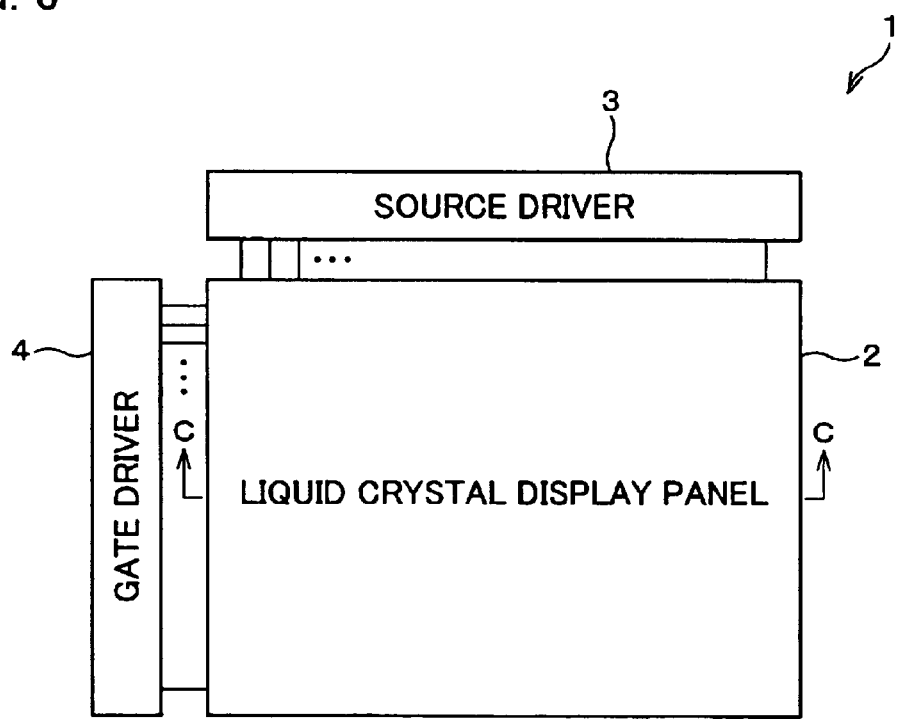
FIG. 6 is a plan view, showing a liquid crystal display in accordance with Embodiment 1 of the present invention.

Now, a liquid crystal display 1 adopting the color filter 10 will be discussed. As shown in FIG. 6, the liquid crystal display 1 includes a liquid crystal display panel 2, source driver 3, and gate driver 4. Note that, the source driver 3 and gate driver 4 are well-known so that the descriptions thereof are omitted. What is dealt with below is the liquid crystal display panel 2.

Figure 7:
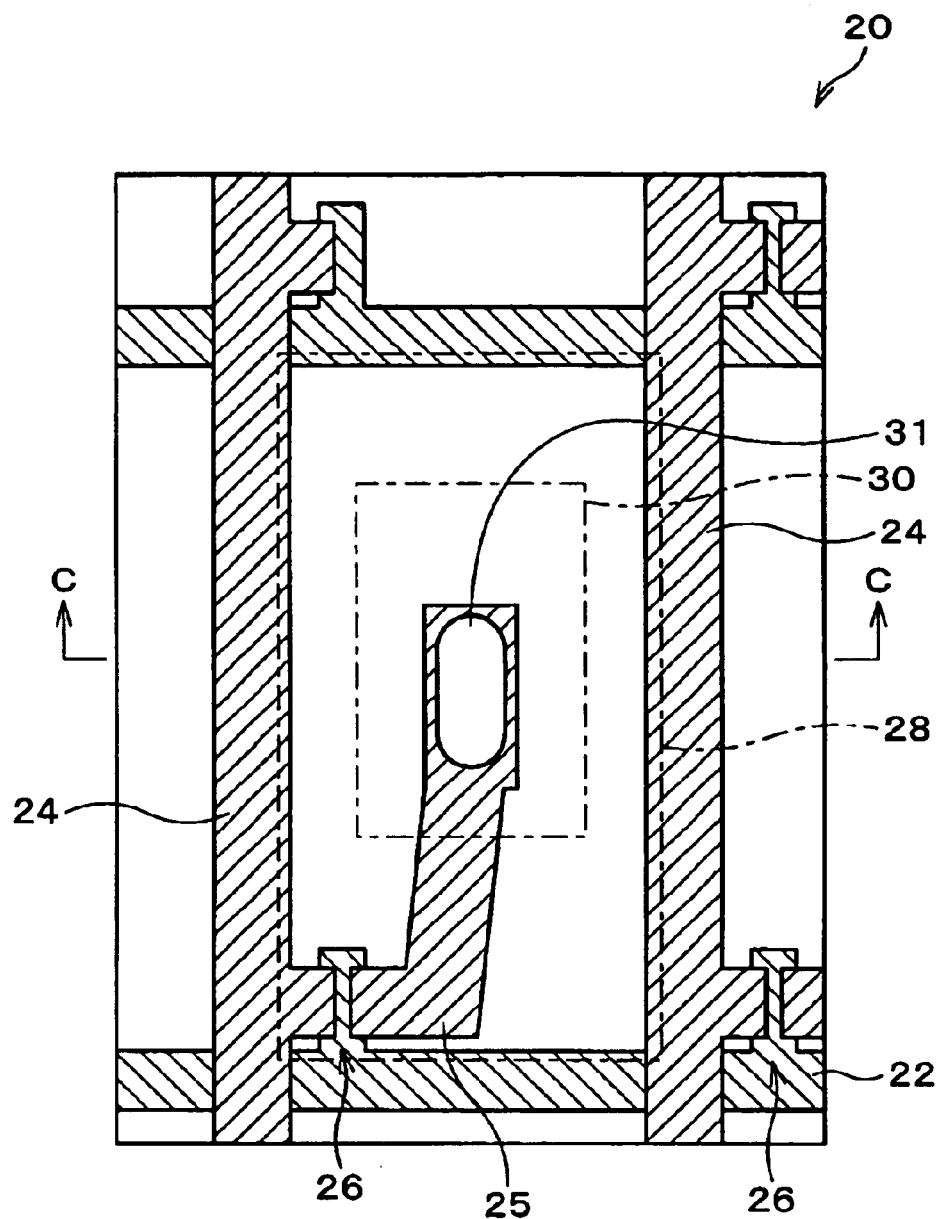
FIG. 7 is a plan view, showing an active matrix substrate in the liquid crystal display of FIG. 6.
Figure 8:
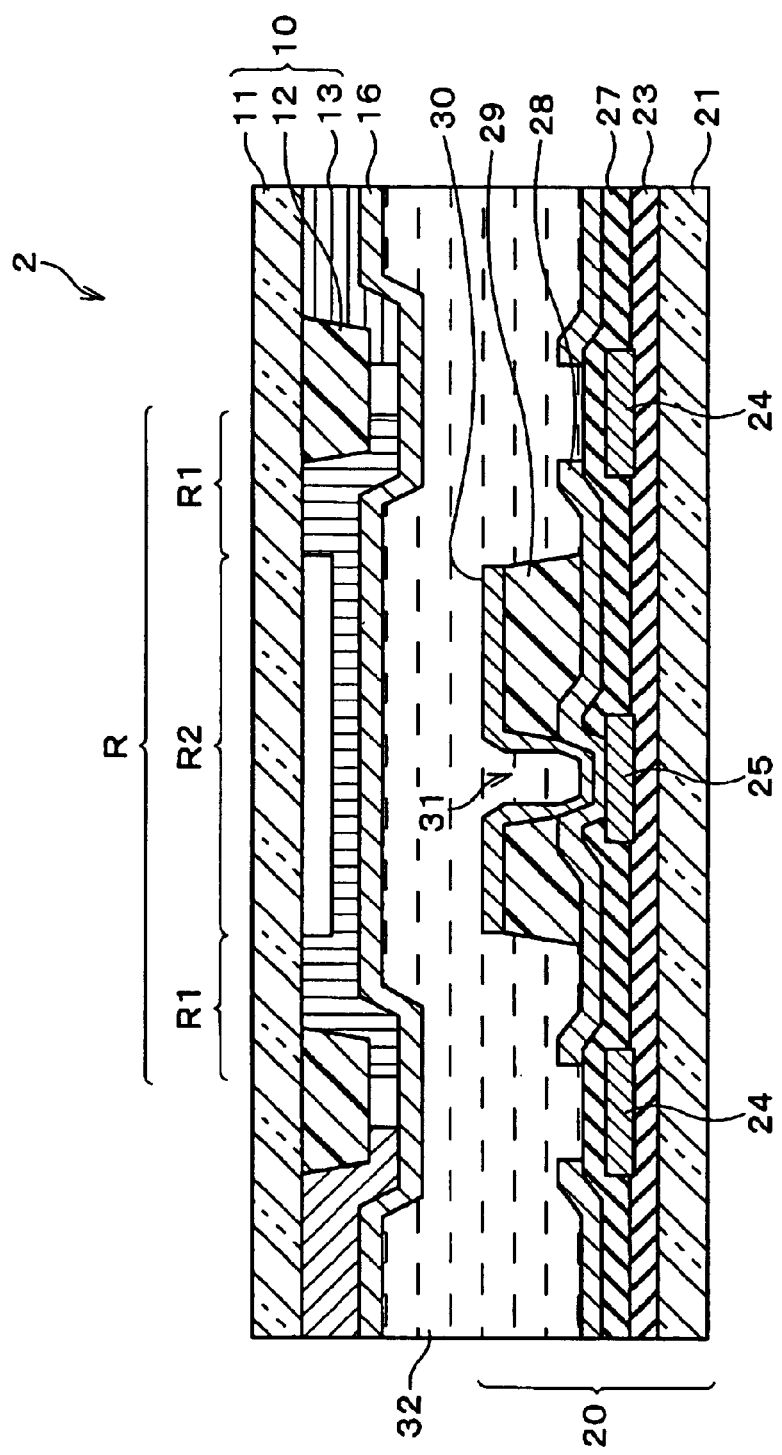
FIG. 8 is a cross section of a liquid crystal display panel of the liquid crystal display in FIG. 6.

The liquid crystal panel 2 includes an active matrix substrate 20 shown in FIG. 7. It is noted that FIG. 7 shows a red pixel in one pixel of the active matrix substrate 20. FIG. 8 shows a cross section of the liquid crystal display panel 2, taken along the line C—C in FIG. 7.

In the liquid crystal panel 2, the active matrix substrate 20 is provided so as to face the color filter 10, and a liquid crystal layer 32 is sandwiched between the color filter 10 and the active matrix substrate 20.

When manufacturing the liquid crystal display panel 2, an ITO film which functions as a common electrode 16 and, for instance, 140 nm thick is formed on the surface of the polysilane film 13 of the color filter 10, by methods such as sputtering.

The active matrix substrate 20 includes a substrate 21 made of materials such as glass, on which gate bus line 22, gate insulating film 23, source bus line 24, drain outgoing line 25, switching element 26, protective film 27, transparent pixel electrode 28, transparent resin later 29, and reflective electrode 30 are provided.

The gate bus line 22 is formed on the substrate 21 and connected to the gate driver 4. The gate insulating film 23 is made of materials such as $SiN_x$ and formed on the substrate 21 and the gate bus line 22. The source bus line 24 is formed on the gate insulating film 23 and connected to the source driver 3. The drain outgoing line 25 is formed on the gate insulating film 23 and on the layer identical with the source bus line 24. The switching element 26 is made up of parts of the gate bus line 22 and source bus line 24, and a semiconductor film which is not illustrated. The protective film 27 is formed on the gate insulating film 23, source bus line 24, and drain outgoing line 25, in order to protect the switching element 26. The transparent pixel electrode 28 is formed on the protective film 27, and functions as an electrode for carrying out transmissive image reproduction. The transparent resin layer 29 is formed on the transparent pixel electrode 28, as a foundation for the reflective electrode 30. The reflective electrode 30 is formed on the transparent resin layer 29, and functions as an electrode for carrying out reflective image reproduction or a reflector for carrying out reflective image reproduction. Thus, the active matrix substrate 20 is a substrate with reflector, including the reflective electrode 30 as a reflector for reflective image reproduction.

In this liquid crystal display panel 2, a predetermined level difference is formed by a transparent resin layer 29 between the transparent pixel electrode 28 and the reflective electrode 30. This level difference is provided for substantially equalizing the length of a light path through which light for transmissive image reproduction passes through the liquid crystal layer 32 and the length of a light path through which light for reflective image reproduction passes through the liquid crystal layer 32.

An outline of a method of manufacturing the active matrix substrate 20 will be given. First, a Ta film is formed on the substrate 21 by sputtering, and the gate bus line 22 is then formed through the steps of photolithography, etching, and separation.

Then films of $SiN_x$, amorphous silicon, and $n^+$ amorphous silicon are successively formed by a CVD method, and a-Si and n+ are caused to have shapes like islands through the steps of photolithography, etching, and separation.

Next, after the $SiN_x$ at a peripheral connecting section is perforated for an external input terminal of the liquid crystal display panel 2 (this process is not illustrated), a Ta film is formed on the entirety by sputtering, and then the source bus line 24 connected to the source electrode of the switching element 26 and the drain outgoing line 25 for connecting the drain electrode of the switching element 26, the transparent pixel electrode 28, and the reflective electrode 30 with each other are formed by the steps of photolithography and etching.

Subsequently, in order to protect a channel section of the switching element 26, an $SiN_x$ film is formed by a CVD method so that the protective film 27 is formed. Then through the protective film 27, a contact hole 31 for connecting the drain outgoing line 25, transparent pixel electrode 28, and reflective electrode 30 with each other and a contact hole for a peripheral drive circuit (not illustrated) are formed by the steps of photolithography and etching.

Then an ITO film is formed and caused to have a predetermined shape through the steps of photolithography and etching, so that the transparent pixel electrode 28 is formed. This transparent pixel electrode 28 is connected to the drain outgoing line 25 via the contact hole 31.

Next, a resin material which is transparent in a visible-light area is applied, and then, by the step of photolithography, a contact hole is formed where the contact hole 31 is provided, and the resin material in the transmission image reproduction area is removed simultaneously with the formation of the contact hole, so that the transparent resin layer 29 is formed.

Then after forming the reflective electrode 30, the reflective electrode 30 is further modified so as to be connected to the drain outgoing line 25 via the contact hole 31.

Through the processes above, the active matrix substrate 20 is formed.

In the liquid crystal display panel 2, the reflective electrode 30 is provided so as to correspond to one of two density areas of the color filter 10, in which an amount of ultraviolet light on the occasion of forming the latent image is fewer than that of the other one of the density areas, i.e. the second density area R2 in the case of the R filter. It is preferable that the second density area R2 corresponds to the reflective electrode 30 in the direction of the normal of the display surface of the liquid crystal display panel 2. However, the quality of image reproduction does not really deteriorate even if the second density area R2 and the reflective electrode 30 are slightly misaligned due to reasons such as the misalignment between the color filter 10 and active matrix substrate 20.

In this manner, the reflective image reproduction is carried out where the second density area R2 faces the reflective electrode 30. In the meantime, the transmissive image reproduction is carried out where the first density area R1 faces that part of the transparent pixel electrode 28 which does not face the reflective electrode 30.

When image reproduction was performed by the liquid crystal display 1 including the above-described liquid crystal display panel 2, it was confirmed that, as a multi-scene display, the liquid crystal display 1 can perform transmissive image reproduction and reflective image reproduction both in high quality.

Figure 9:
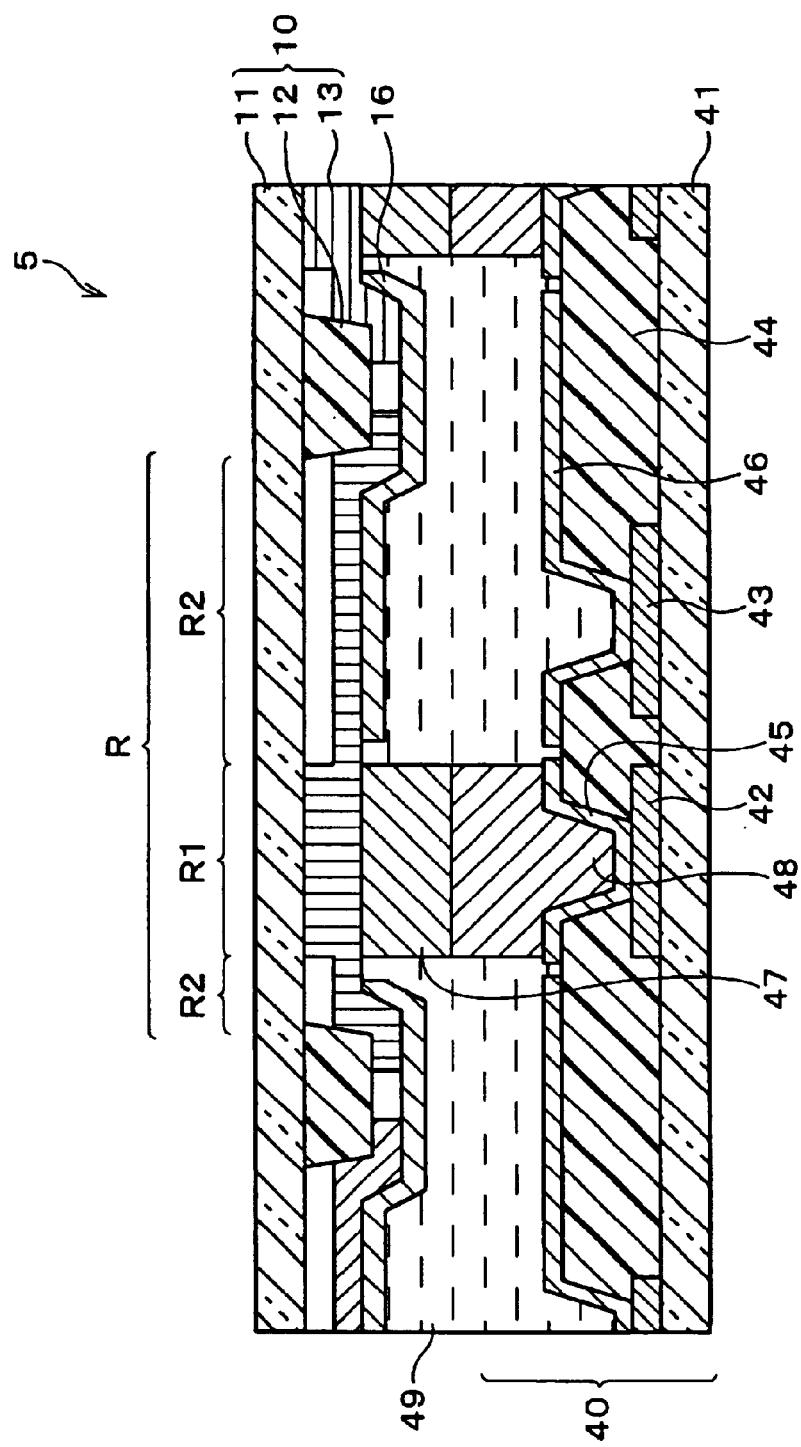
FIG. 9 is a cross section of a hybrid display panel in accordance with Embodiment 1 of the present invention.

Note that, the color filter 10 can be also adopted to various types of devices other than the liquid crystal display 1. For instance, it is possible to incorporate the color filter 10 into a hybrid display including liquid crystal elements and organic electro-luminescent (EL) elements. Referring to FIG. 9, a hybrid display panel 5 included in the hybrid display will be discussed below.

It is noted that, a color filter 10 in the hybrid display panel 5 has first and second density areas whose patterns are different from those of the above-mentioned color filter 10. This alteration of the patterns can be realized by changing the exposure patterns of the exposure masks used in the latent image forming step. Furthermore, on a part of the surface of the polysilane film 13 of the color filter 10, an ITO film, which is the common electrode 16 and, for instance, 140 nm thick, is formed by methods such as sputtering.

In the hybrid display panel 5, an active matrix substrate 40 is disposed so as to face the color filter 10. Between the color filter 10 and active matrix substrate 40, a liquid crystal layer 49 is sandwiched.

The active matrix substrate 40 includes a substrate 41 made of materials such as glass, on which an EL switching element 42, liquid crystal switching element 43, planarizing film 44, EL electrode 45, reflective electrode 46, organic EL element 47, and conductive contact layer 48.

Note that, despite not being discussed below, members such as the gate bus line, gate insulating film, and source bus line are formed between the substrate 41 and planarizing film 44 in the active matrix substrate 40, as in the active matrix substrate 20.

Although FIG. 9 shows the organic EL element 47 in a simplified manner, in reality, the organic EL element 47 has a multi-layer structure so that a cathode, electron transfer layer, luminous layer, hole transfer layer, and anode are successively formed on the conductive contact layer 48.

The hybrid display panel 5 described as above carries out self-luminous image reproduction using the organic EL element 47, as non-reflective image reproduction. Reflective image reproduction, on the other hand, is carried out using the reflective electrode 46 as in the liquid crystal display panel 2. In other words, in the hybrid display panel 5, the self-luminous image reproduction is carried out where the first density area R1 faces the organic EL element 47, whereas the reflective image reproduction is carried out where the second density area R2 faces the reflective electrode 46.

On this account, also in the hybrid display panel 5, the reflective electrode 46 is provided so as to correspond to one of two density areas of the color filter 10, in which an amount of ultraviolet light on the occasion of forming the latent image is fewer than that of the other one of the density areas, i.e. the reflective electrode 46 is provided so as to correspond to the second density area R2 in the case of the R filter.

It is further noted that the active matrix substrate 40 of the hybrid display panel 5 is also a substrate with reflector, including the reflective electrode 46 as a reflector for the reflective image reproduction.

The present embodiment has discussed the liquid crystal display panel 2 and hybrid display panel 5, which include, in one pixel, the area for reflective image reproduction and the area for non-reflective image reproduction. However, the use of the color filter of the present invention is not limited to the above. For instance, the color filter of the present invention can be suitably incorporated into a display panel made up of a part where pixels for reflective image reproduction are provided and a part where pixels for non-reflective image reproduction are provided. Furthermore, as a color filter in which a plurality of density areas having different color densities are provided for each color, the color filter of the present invention can be used not only for multi-scene displays which can carry out both reflective image reproduction and non-reflective image reproduction but also for many other uses.

In the present embodiment, the liquid crystal element is adopted as an element for carrying out both reflective image reproduction and transmissive image reproduction. However, the present invention is not limited to this so that other types of elements such as an electrochromic element may be adopted. Also, although the present embodiment uses the organic EL element as an element for self-luminous image reproduction, other types of elements such as an inorganic EL element and a plasma display element may be adopted.

Embodiment 2

The following will describe another embodiment of the present invention with reference to FIGS. 10(a)–10(i) through 13. What will be discussed in the present embodiment is a method of manufacturing a color filter which is different from that of Embodiment 1. Note that, however, the color filter of the present embodiment is basically identical with the color filter of Embodiment 1 in terms of functions and uses, and members constituting the color filter of the present embodiment are basically identical with those of the color filter of Embodiment 1, even if the shapes of some members are different to some extent. Thus, the members corresponding to the members constituting the color filter of Embodiment 1 are given the same numbers, and descriptions are given only when a member of the present embodiment is different from a counterpart constituting the color filter of Embodiment 1.

The following will describe a method of manufacturing a color filter 50 of the present embodiment with reference to FIGS. 10(a)–10(i). It is noted that the steps illustrated in FIGS. 10(a)–10(f) correspond to the steps shown in FIGS. 1(a)–1(f) of Embodiment 1, and the steps shown in FIGS. 10(g)–10(i) correspond to the steps shown in FIGS. 1(g) and 1(h) of Embodiment 1. On this account, the following will only discuss those points in the steps of the present embodiment, which are different from the steps in Embodiment 1.

Figure 10:
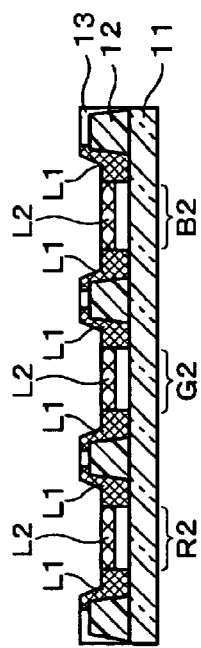
FIGS. 10(a)–10(i) are cross sections, showing the steps of manufacturing a color filter of Embodiment 2 of the present invention.
Figure 10:
Figure 10:
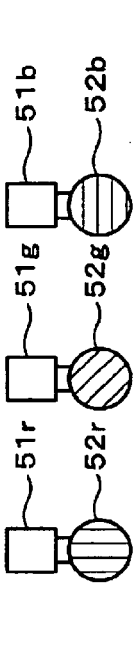
Figure 10:
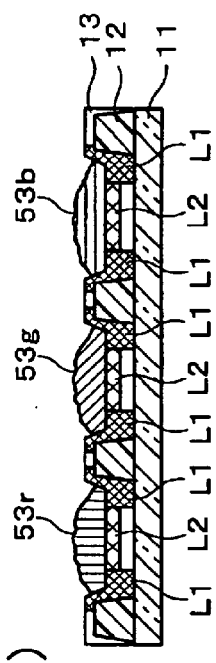
Figure 10:
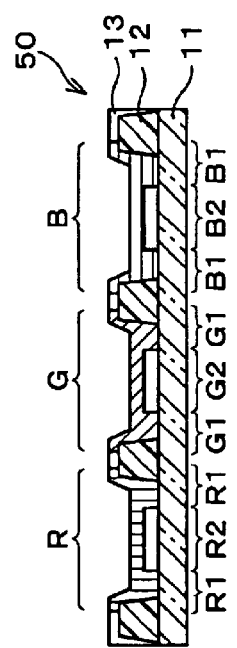

The method of manufacturing the color filter 50 of the present embodiment is arranged in such a manner that, in a coloration step shown in FIGS. 10(g)–10(i), colorants are applied to the surface of the polysilane film 13 by an inkjet method using inkjet nozzles 51r, 51g, and 51b corresponding to the respective hue areas. In this step, the colorants corresponding to the respective hues are simultaneously applied to the respective hue areas.

On this account, it is unnecessary to repeat the latent image forming step for each hue area as in Embodiment 1, and hence latent images are formed in the respective hue areas by carrying out the common latent image forming step.

That is to say, as a result of the first exposure process shown in FIGS. 10(c) and 10(d) in the latent image forming step, first latent images L1 are simultaneously formed in the respective hue areas. Thus, in the first exposure process, a third exposure mask 14c for causing the first density areas R1, G1, and B1 in the respective hue areas to be simultaneously exposed to the light is used.

Through a second exposure process shown in FIGS. 10(e) and 10(f) of the latent image forming step, second latent images L2 are also simultaneously formed in the respective hue areas. Here, provided that a first exposure light amount M is set to be not less than a saturated exposure light amount S and a second exposure light amount N is set to be less than a saturated exposure light amount S, it is possible to carry out, in the second process, the exposure without using an exposure filter. With this, the second exposure process is simplified.

In this manner, while, in Embodiment 1, the steps shown in FIGS. 1(c)–1(h) have to be repeated for the respective hue areas, the present embodiment is arranged so that the steps 10(c)–10(i) are carried out only once for all of the hue areas. Thus, the number of the steps is reduced in Embodiment 2.

Next, the following will discuss a method of coloring the first and second latent images L1 and L2 by applying colorants to the surface of the polysilane film 13 by an inkjet method. In the coloration step, either the inkjet nozzles 51r, 51g, and 51b or the substrate 11 are/is caused to carry out scanning in the direction perpendicular to FIG. 10(g), that is to say, along the respective hue areas, and droplets 52r, 52g, and 52b of the colorants are successively dropped from the respective inkjet nozzles 51r, 51g, and 51b. As a result, as FIG. 10(h) shows, the whole surfaces of the second latent images L1 and L2 are substantially covered with puddles 53r, 53g, and 53b of the colorants.

After being left for 180 seconds at 40° C., the colorants remaining on the surfaces of the second latent images L1 and L2 are removed using an air knife. Subsequently, the polysilane film 13 and the substrate 11 are washed using pure water, and then heated and dried for, for instance, 90 minutes at 180° C. As a result, the colorants are fixed to the polysilane film 13.

As described above, the colorants are applied only to the portions required to be colored, according to the application of the colorants using the inkjet method. Thus, amounts of the required colorants are substantially minimized, so that the materials cost can be effectively reduced.

Now, the characteristics of the application of the colorants to the surface of the polysilane film 13 using the inkjet method will be discussed.

When the colorants corresponding to the respective hues are simultaneously applied to the respective hue areas, it is necessary to prevent these colorants from being mixed with each other. To do so, it is preferable that a black matrix 12 is formed to be thicker than that of Embodiment 1 so that sidewalls W between the hue areas are caused to be higher than those of Embodiment 1. For instance, the polysilane film 13 is formed to be 1.5 μm thick as in Embodiment 1, while the black matrix 12 is formed to be 2.0 μm thick so as to be thicker than the black matrix 12 of Embodiment 1.

To prevent the occurrence of irregularities of color density in the hue areas, it is preferable that the puddles 53r, 53g, and 53b are formed so as to have uniform thicknesses in the direction of the scanning. However, when the black matrix 12 is arranged as in FIG. 2, the cells R, G, and B are partitioned by the black matrix 12 in the direction of the scanning, so that the droplets 52r, 52g, and 52b having been dropped hardly flow in the direction of the scanning, and hence it is difficult to cause the puddles 53r, 53g, and 53b to have uniform thicknesses.

Figure 11:
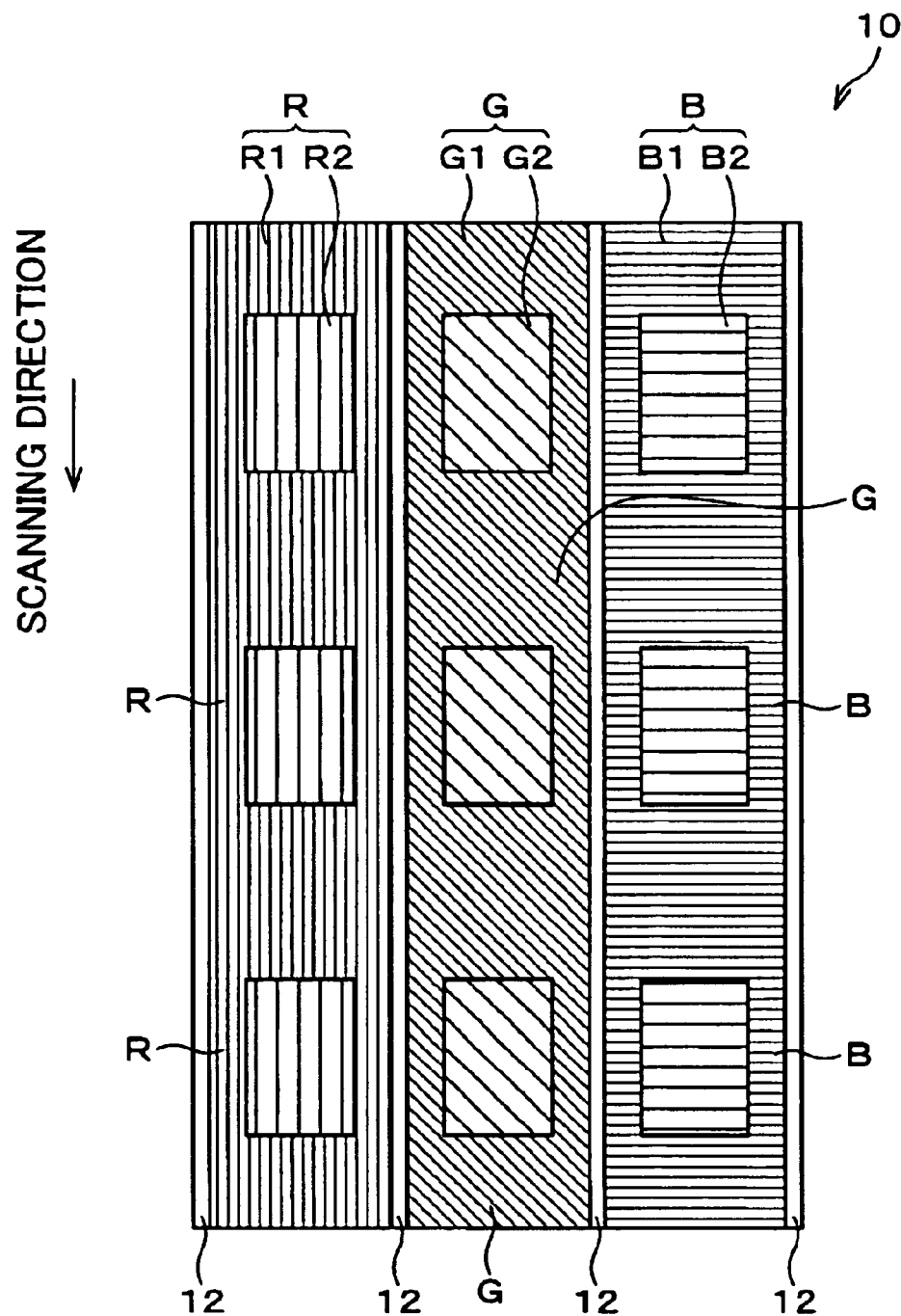
FIG. 11 is a plan view of the color filter of Embodiment 2 of the present invention.

To solve this problem, the black matrix 12 is preferably arranged so as not to partition the cells R, G, and B in the direction of the scanning, as in FIG. 11.

However, even if the black matrix 12 is arranged as in FIG. 11, the puddles 53r, 53g, and 53b may not be formed to have irregular thicknesses, depending on scanning speed. This is because the reason as below.

Figure 12:
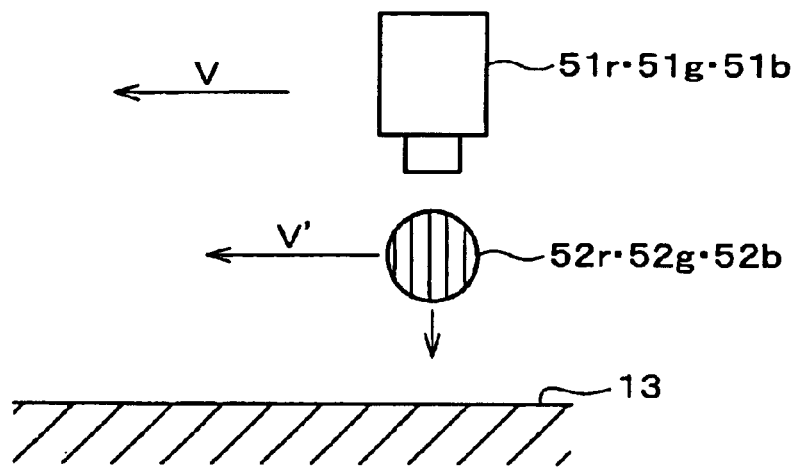
FIGS. 12(a) and 12(b) are schematic views for illustrating the relationship between a scanning speed of inkjet nozzles on the occasion of applying colorants by the same and shapes of puddles of the colorants.
Figure 12:
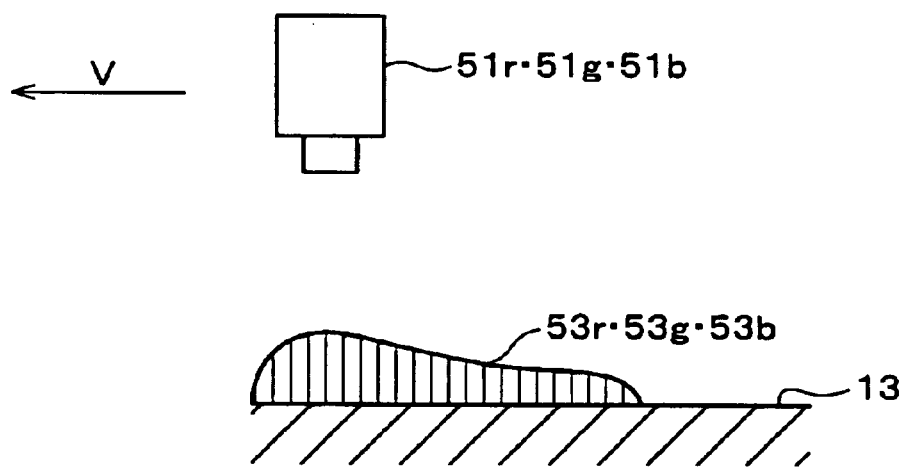

As FIG. 12(a) shows, when the inkjet nozzles 51r, 51g, and 51b are discharging the respective droplets 52r, 52g, and 52b, these inkjet nozzles 51r, 51g, and 51b are moving at a predetermined scanning speed V with respect to the polysilane film 13. On this account, the droplets 52r, 52g, and 52b being discharged are also moving at a speed V' substantially identical with the scanning speed V, with respect to the polysilane film 13. The droplets 52r, 52g, and 52b landed in the surface of the polysilane film 13 flow in the direction of the movement of the inkjet nozzles 51r, 51g, and 51b, due to inertial force. As a result, the droplets 52r, 52g, and 52b become the respective puddles 53r, 53g, and 53b.

When the speed V' is relatively small, the puddles 53r, 53g, and 53b are formed to have uniform thicknesses. On the contrary, when the speed V' is large, as FIG. 12(b) shows, the puddles 53r, 53g, and 53b are formed to be unbalanced in the direction of the downstream of the scanning, so that the puddles 53r, 53g, and 53b have irregular thicknesses. However, the scanning speed V is preferably as large as possible, in consideration of the throughput of the coloration step.

Figure 13:
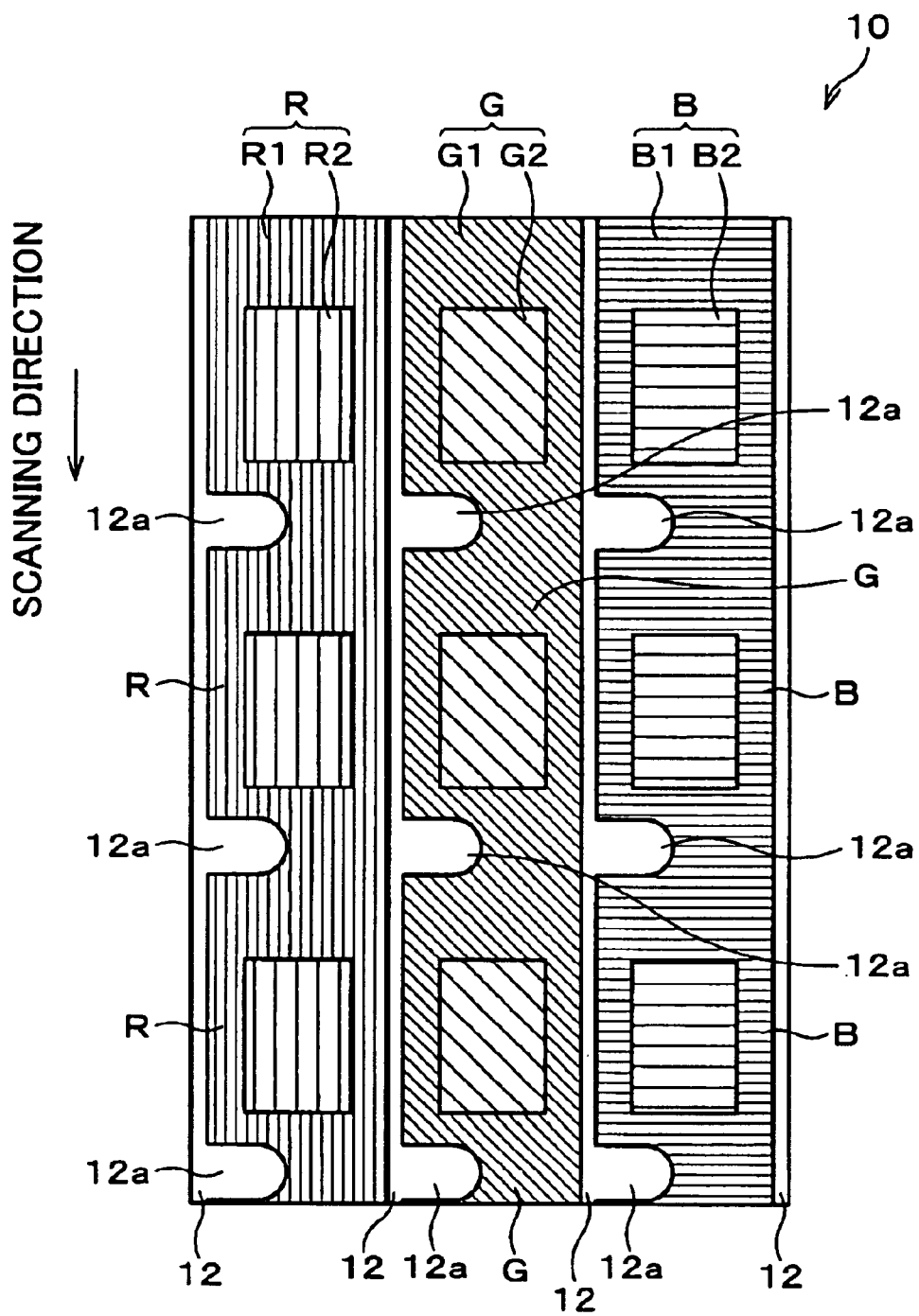
FIG. 13 is a plan view of another color filter in accordance with Embodiment 2 of the present invention.
Figure 14:
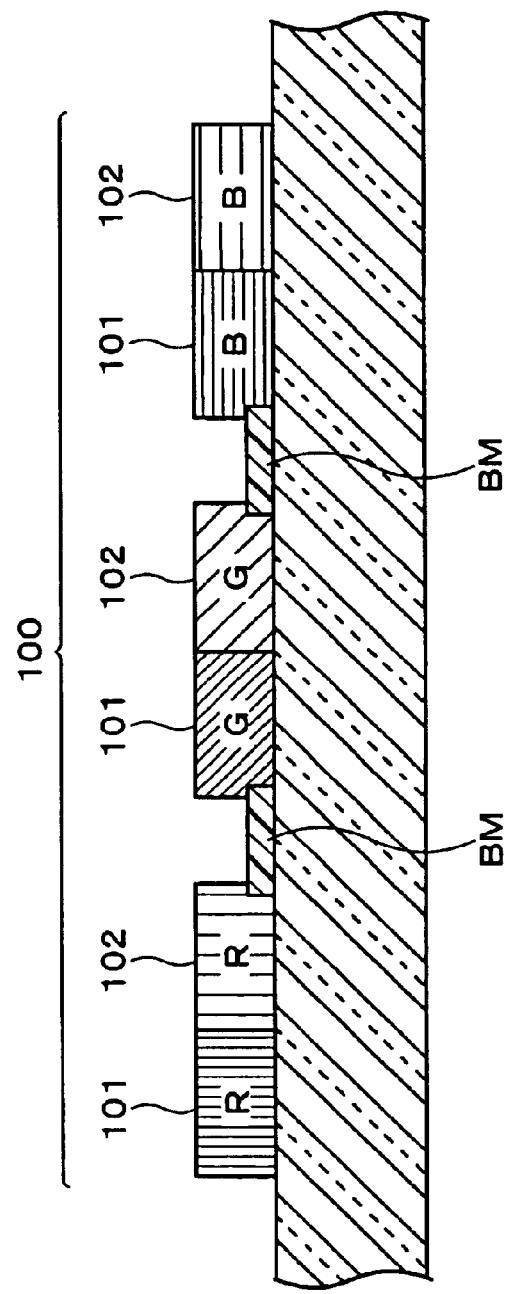
FIG. 14 is a cross section of a conventional color filter.
Figure 15:
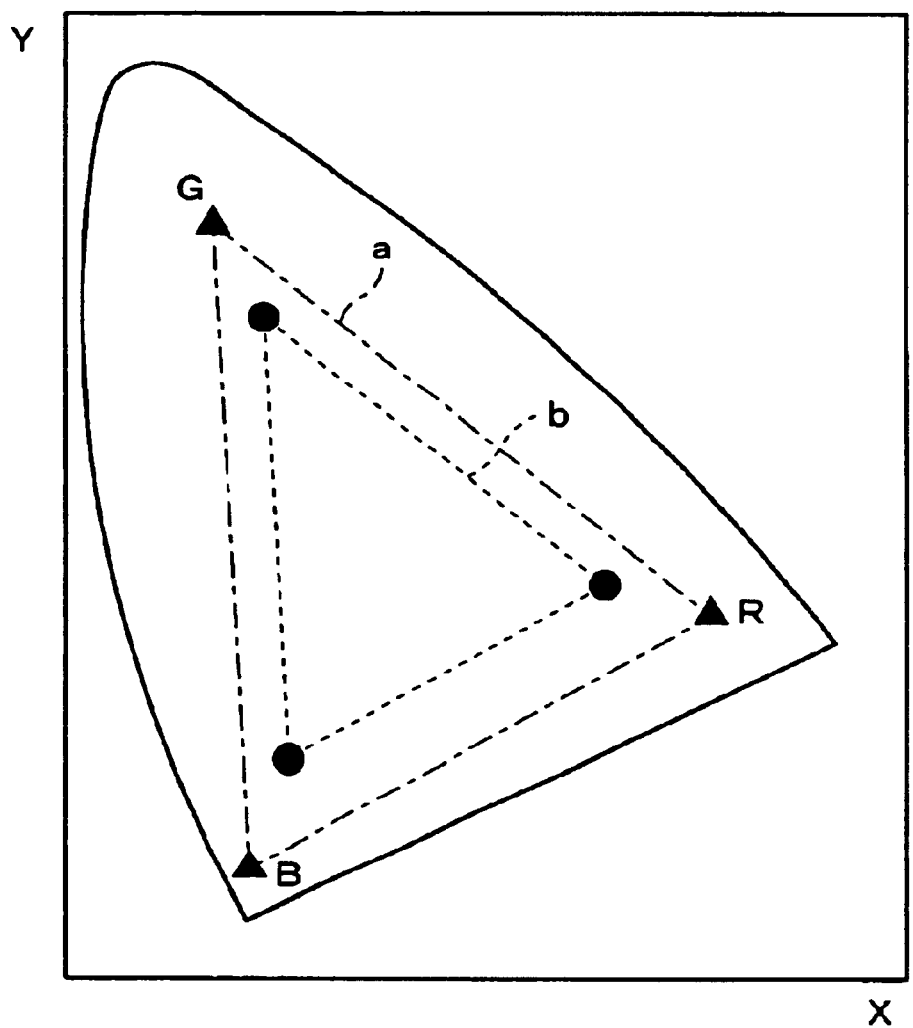
FIG. 15 is a graph, showing the chromaticity of the color filter shown in FIG. 14.

To increase the scanning speed V while causing the puddles 53r, 53g, and 53b to have uniform thicknesses, it is preferable to form barriers 12a as shown in FIG. 13. These barriers 12a are parts of the black matrix 12, the parts protruding in the direction orthogonal to the direction of the scanning, for restraining the flow of the droplets 52r, 52g, and 52b on the occasion of landing-in. Note that, to prevent the decrease of an open area ratio, which is caused when the color filter 10 is incorporated into a display, it is preferable that the walls 12a are provided so as to overlap light-blocking members such as a switching element.

As described above, the manufacturing method of the present embodiment is arranged so that the latent image forming step is commonly carried out for all of the hue areas, and, in the coloration step, the colorants corresponding to the respective hues are applied to the respective hue areas.

In this manufacturing method, it is unnecessary to repeat the latent image forming step and coloration step for the respective hue areas, thus being possible to reduce the number of steps. Furthermore, since, in the coloration step, the colorants are applied to the respective hue areas, it is possible to substantially minimize the amount of the required colorants, so that the materials cost can be effectively reduced.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a color filter, comprising the steps of:

(i) forming latent images, in which a photosensitive film is subjected to, with a predetermined exposure patterns an exposure process using a predetermined type of light, the photosensitive film being altered to be colorable by a colorants when exposed to the predetermined type of light and a degree of colorability of the photosensitive film varying in accordance with an exposure amount of the predetermined type of light, so that the latent images in accordance with the predetermined exposure pattern are formed on the photosensitive film; and (ii) coloring the latent images by applying the colorants to the photosensitive film on which the latent image have been formed, with different exposure patterns and different exposure light amounts, the exposure process in the step (i) being repeated more than once.

2. The method as defined in claim 1, wherein, the step (ii) is carried out after repeating the exposure process, so that latent images formed as a result of repeating the exposure process are simultaneously colored.

3. The method as defined in claim 1, wherein, a first exposure light amount in a first exposure process which is one occasion of the exposure process being repeated is set to be not less than a saturated exposure light amount at which color density when coloring the photosensitive film in the step (ii) carried out later is saturated, and a second exposure light amount in a second exposure process which is another occasion of the exposure process begin repeated is set to be less than the saturated exposure light amount.

4. The method as defined in claim 3, wherein, the exposure patterns corresponding to the first and second exposure processes, respectively, have respective overlapped parts where the exposure patterns overlap each other.

5. The method as defined in claim 1, further comprising, in order to form more than one hue areas having different hues, the steps (i) and (ii) for respective hue areas.

6. The method as defined in claim 5, wherein, after the step (ii) for one of said more than one hue areas, the step (i) for next one of said more than one hue areas is carried out.

7. The method as defined in claim 1, wherein, to form more than one hue areas having different hues, the step (i) is commonly carried out for all of said more than one hue areas, and in the step (ii) colorants corresponding to the respective hues are applied to said more than one hue areas.

8. The method as defined in claim 7, wherein, in the step (ii), said more than one hue areas are covered with respective puddles of the colorants, using inkjet nozzles corresponding to said more than one hue areas, respectively, so that the colorants are applied.

9. The method as defined in claim 8, wherein, to cause the puddles to have uniform thicknesses, a black matrix is formed so as not to partition cells in a direction of scanning by the inkjet nozzles.

10. The method as defined in claim 8, wherein, to increase a scanning speed of the inkjet nozzles and to cause the puddles to have uniform thicknesses, parts of a black matrix protrude in a direction orthogonal to a direction of scanning by the inkjet nozzles.

11. The method as defined in claim 7, further comprising the steps of:

(iii) forming a black matrix on a substrate; and (iv) forming the photosensitive film on the black matrix, the steps (iii) and (iv) being carried out before the steps (i) and (ii), and the black matrix being sufficiently high in height so that the colorants are not mixed with each other.

12. The method as defined in claim 1, herein, the photosensitive film is a polysilane film, and the predetermined type of light is ultraviolet light.

13. A color filter including sets of a plurality of density areas having different color densities, the sets corresponding to respective colors, the color filter comprising a photosensitive film which alters to be colorable by a colorants when exposed to a predetermined type of light and whose degree of colorability varies in accordance with an amount of the predetermined type of light for exposure, wherein, said plurality of density areas are formed in such a manner that, the photosensitive film is subjected to exposure to different rays of light, with different exposure patterns and different exposure light amounts, so that latent images corresponding to the respective exposure patterns are formed, and then these latent images are colored by applying the colorants to the respective latent images.

14. A display, comprising the color filter defined in claim 13.

15. A display, which can carry out both reflective image reproduction and non-reflective image reproduction, comprising:

the color filter defined in claim 13;

a reflector for the reflective image reproduction; and a substrate with the reflector, the substrate facing the color filter, wherein, said plurality of density areas are two density areas of different types, and the reflector is provide so as to correspond to one density area of said two density areas, in said one density area, an exposure light amount of said predetermined type of light when forming the latent images being fewer than an exposure light amount in the other one of said two density areas.

16. A color filter including sets of a plurality of density areas having different color densities, the sets corresponding to respective colors, the color filter comprising a photosensitive film which alters to be colorable by a colorants when exposed to a predetermined type of light and whose degree of colorability varies in accordance with an amount of the predetermined type of light used for exposure, wherein, said plurality of density areas have different coloration depths in a direction perpendicular to the photosensitive film.

17. A display, comprising the color filter defined in claim 16.

18. A display, which can carry out both reflective image reproduction and non-reflective image reproduction, comprising:

the color filter defined in claim 16;

a reflector for the reflective image reproduction; and a substrate with the reflector, the substrate facing the color filter, wherein, said plurality of density areas are two density areas of different types, and the reflector is provided so as to correspond to one density area of said two density areas, in said one density area, a coloration depth in a direction perpendicular to the photosensitive film being shallover than a coloration depth in the other one density area of said two density areas.

19. A method of manufacturing a color filter comprising the steps of:

providing a photosensitive film;

altering the colorability of a first portion, comprising a first pattern, of the photosensitive film by exposing the first portion to a first amount of light;

altering the colorability of a second portion, comprising a second pattern, of the photosensitive film by exposing the second portion to a second amount of light different than the first amount of light; and applying a first colorants to the photosensitive film to color the first and second portions of the photosensitive film.

20. The method of claim 19 wherein said step of altering the colorability of a first portion, comprising a first pattern, of the photosensitive film by exposing the first portion to a first amount of light comprises the step of altering the colorability of a first region surrounding a second region.

21. The method of claim 20 wherein said step of altering the colorability of a second portion, comprising a second pattern, of the photosensitive film by exposing the second portion to a second amount of light comprises the step of a altering the colorabilty of the second region.

22. The method of claim 20 wherein said step of altering the colorability of a second portion, comprising a second pattern, of the photosensitive film by exposing the second portion to a second amount of light comprises the step of exposing a part of the first portion to the second amount of light.

23. The method of claim 19 including the additional steps of:

altering the colorability of a third portion, comprising a third pattern, of the photosensitive film by exposing the third portion to a third amount light;

altering the colorability of a fourth portion, comprising a fourth pattern, of the photosensitive film by exposing the fourth portion to a fourth amount of light different than the third amount of light; and applying a second colorants to the photosensitive film to color the third portion and the fourth portion of the photosensitive film.

24. A method of manufacturing a color filter, comprising the steps of:

providing a photosensitive film;

altering the colorability of a first portion, comprising a first pattern, of the photosensitive film by exposing the first portion to a first amount of light;

altering the colorability of a second portion, comprising a second pattern, of the photosensitive film by exposing the second portion to a second amount of light different than the first amount of light;

altering the colorability of a third portion, comprising a third pattern, of the photosensitive film by exposing the third portion to a third amount of light;

altering the colorability of a fourth portion, comprising a fourth pattern, of the photosensitive film by exposing the fourth portion to a fourth amount of light different than the third amount of light; and applying a first colorants to the first portion and the second portion and a second colorants to the third portion and the fourth portion using an ink jet nozzle.

25. A color filter comprising:

a photosensitive film having a colorability affected by exposure to light, said photosensitive film including first color region having a first area of a first coloration depth and a second area of a second coloration depth different than said first coloration depth and a second color region comprising a third area of a third coloration depth and a fourth area of a fourth coloration depth different than said third coloration depth.

26. The color filter of claim 25 wherein said first coloration depth is approximately equal to said third coloration depth.

27. The color filter of claim 25 wherein said first area surrounds said second color area.

* * * * *